(12) United States Patent
Yao et al.

(10) Patent No.: US 9,864,105 B2
(45) Date of Patent: Jan. 9, 2018

(54) STRESS MANIPULATED COATING FOR FIGURE RESHAPE OF OPTICAL SUBSTRATES

(71) Applicant: Northwestern University, Evanston, IL (US)

(72) Inventors: Youwei Yao, Evanston, IL (US); Melville Paul Ulmer, Evanston, IL (US); Jian Cao, Wilmette, IL (US); Xiaoli Wang, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 15/166,637

(22) Filed: May 27, 2016

(65) Prior Publication Data

US 2016/0349410 A1 Dec. 1, 2016

Related U.S. Application Data

(60) Provisional application No. 62/167,423, filed on May 28, 2015.

(51) Int. Cl.
| | |
|---|---|
| *G02B 1/10* | (2015.01) |
| *C23C 14/54* | (2006.01) |
| *C23C 14/35* | (2006.01) |
| *C23C 14/04* | (2006.01) |
| *C23C 14/18* | (2006.01) |
| *C23C 14/34* | (2006.01) |

(52) U.S. Cl.
CPC ............. *G02B 1/10* (2013.01); *C23C 14/042* (2013.01); *C23C 14/185* (2013.01); *C23C 14/345* (2013.01); *C23C 14/35* (2013.01)

(58) Field of Classification Search
None
See application file for complete search history.

(56) References Cited

U.S. PATENT DOCUMENTS

| 5,500,312 A | 3/1996 | Harriott |
|---|---|---|
| 7,250,839 B2 | 7/2007 | Racz |
| 2014/0093881 A1* | 4/2014 | Sugnet .................... H03M 7/30 |
| | | 435/6.12 |

OTHER PUBLICATIONS

Windischmann, Henry; Intrinsic Stress in Sputter-Depositied Thin Films; Dec. 1992; BP America; pp. 547-596.*
Wang, X., et al., Experimental study and analytical model of deformation of magnetostrictive films as applied to mirrors for x-ray space telescopes, Applied Optics, vol. 53, No. 27, Sep. 20, 2014, pp. 6256-6267.

(Continued)

*Primary Examiner* — Tahseen N Khan
(74) *Attorney, Agent, or Firm* — Bell & Manning, LLC

(57) ABSTRACT

A method of forming a stress distributed coating layer is provided which comprises depositing a coating material emanating from a source at a first location on a backside of an optical substrate at a first bias voltage to provide a first coating region at the first location characterized by a first stress and depositing the coating material at a second location on the backside of the optical substrate at a second bias voltage to provide a second coating region at the second location characterized by a second stress, thereby forming a stress distributed coating layer on the backside of the optical substrate comprising the first and second coating regions. Deposition systems and coated optical substrates are also provided.

16 Claims, 20 Drawing Sheets

(56) References Cited

OTHER PUBLICATIONS

Windischmann, H., Intrinsic stress in sputter-deposited thin films, Crit. Rev. Solid State Mat. Sci., vol. 17, No. 6, 1992, pp. 547-596.
Yao, Youwei, et al., Stress manipulated coating for fabricating lightweight X-ray telescope mirrors, Optics Express, vol. 23, No, 22, Nov. 2, 2015, pp. 28605-28618.
Kilaru, K., et al., Differential deposition technique for figure corrections in grazing-incidence x-ray optics, Optical Engineering, 50(10), Oct. 2011, pp. 106501-1-106501-6.
Chan, Kai-Wing, et al., Reflective Coating for Lightweight X-ray Optics, Proc. of SPIE vol. 8443, Sep. 7, 2012, pp. 84433S-1-84433S-11.
Chalifoux, B., et al., High-precision figure correction of x-ray telescope optics using ion implantation, Proc. of SPIE vol. 8861, Sep. 26, 2013, pp. 88610T-1-88610T-13.
Ulmer, M.P., et al., Magnetic smart material application to adaptive X-ray optics, Proc. of SPIE vol. 7803, Aug. 19, 2010, pp. 780309-1-780309-11.
Cotroneo, V., et al., Adjustable grazing incidence x-ray optics based on thin PZT films, Proc. of SPIE vol. 8503, Oct. 19, 2012, pp. 850309-1-850309-10.
Ulmer, M.P., et al., Progress report on using magneto-strictive sputtered thin films to modify the shape of a X-ray telescope mirror, Proc. of SPIE vol. 8503, Oct. 15, 2012, pp. 85030C-1-85030C-8.

\* cited by examiner

STRESS MANIPULATED COATING FOR FIGURE RESHAPE OF OPTICAL SUBSTRATES

CROSS-REFERENCE TO RELATED APPLICATIONS

This application claims priority from U.S. provisional patent application Ser. No. 62/167,423, filed on May 28, 2015, which is hereby incorporated by reference in its entirety.

REFERENCE TO GOVERNMENT RIGHTS

This invention was made with government support under NNX11AG05G-000005 awarded by the National Aeronautics and Space Administration. The government has certain rights in the invention.

BACKGROUND

The next generation of major US X-ray missions has a default goal to get an effective area at least 10 times larger than the Chandra X-ray Observatory (CXO), a similar angular resolution (i.e., <1 arc-second), and lower cost and mass per effective area. The effective area of the Chandra High Resolution X-ray Mirror Assembly (CHXMA) was, however, about 400 cm$^2$ and the effective area per unit mass was about 0.5 cm$^2$/kg. Thus, a boost of about 10 times in area requires so much costly smooth (<0.5 nm) surface as to require a replication process to bring down the mirror fabrication cost. Furthermore, the low ratio of effective area to mass of the CHXMA translates into an unacceptably high launch cost, even if the fabrication costs for Chandra-like mirrors could be reduced significantly. Hence, thin and lightweight replicated optics are called for. However, as the mirror quality of replicated mirrors may be less than desired, post fabrication processes have been explored to correct the mirror figure in order to bring the mirror quality to within specifications of figure accuracy and mass/unit area. These post fabrication processes have included the use of piezoelectric materials, magnetic smart materials (MSMs) and ion implantation.

SUMMARY

In one aspect, a method of forming a stress distributed coating layer is provided, the method comprising depositing a coating material emanating from a source at a first location on a backside of an optical substrate at a first bias voltage to provide a first coating region at the first location characterized by a first stress; and depositing the coating material at a second location on the backside of the optical substrate at a second bias voltage to provide a second coating region at the second location characterized by a second stress; wherein bias voltage refers to a voltage difference between the source and the backside of the optical substrate, thereby, forming a stress distributed coating layer on the backside of the optical substrate comprising the first and second coating regions.

In another aspect, a deposition system for forming a stress distributed coating layer is provided, the system comprising: a deposition apparatus comprising a source from which a coating material emanates, the source configured to restrict a flux of the coating material towards an optical substrate; a holder configured to hold the optical substrate; a drive system configured to provide relative translation of the source and the optical substrate; and a bias voltage power supply operably coupled to the source and the optical substrate and configured to apply different bias voltages between the source and the optical substrate as a function of the relative position of the source and the optical substrate.

Coated optical substrates formed using the deposition methods and deposition systems are also provided.

BRIEF DESCRIPTION OF THE DRAWINGS

Illustrative embodiments of the invention will hereafter be described with reference to the accompanying drawings, wherein like numerals denote like elements.

FIG. 9A shows the measured surface profile of the glass strip ("measured surface before coating"), the desired surface profile ("initial surface in FEA model"), which in this case was taken to be the initial surface profile for purposes of the optimization process of FIG. 8, and the surface profile obtained after the optimization process of FIG. 8 ("optimized surface profile"). The "measured surface before coating" matches the "optimized surface profile. " FIG. 9B shows the optimized stress distribution for the coating to be deposited using the deposition apparatus of FIG. 1. Positive values indicate compressive stress. FIG. 9C shows the evolution of the merit function (MF) versus the iteration steps using the optimization process of FIG. 8. FIG. 9D shows the measured surface profile of the glass strip before coating and after coating.

FIG. 11A shows the initial surface profile of the mirror ("measured") and the surface profiles obtained after the optimization process of FIG. 8 for three different mirror thicknesses. FIGS. 11B-11D show the optimized stress distribution for the coating for a 0.2 mm thick mirror (FIG. 11B), a 0.4 mm thick mirror (FIG. 11C), and a 0.8 mm thick mirror (FIG. 11D). Positive values indicate compressive stress; negative values indicate tensile stress.

DETAILED DESCRIPTION

Provided herein are deposition systems and methods for adjusting and/or correcting a surface figure of an optical substrate.

The deposition systems and methods may be used to provide a stress distributed coating layer on an optical substrate, the optical substrate which may be characterized by a surface profile which deviates from a target surface profile. The stress distributed coating layer may be characterized by a stress distribution which is configured to apply the appropriate stress at appropriate locations on the optical substrate so as to correct the deviations from the target surface profile. In at least some embodiments, the deposition systems and methods are able to achieve shape changes large enough to correct the typical figure errors associated with replicated optical substrates (e.g., about 10 arc-seconds to about 20 arc-seconds). In addition, the corrected surface profiles induced by the stress distributed coating layers are stable, reproducible, and do not require any active control to maintain. The coated optical substrates may find use in a variety of applications, such as telescopes and other instruments for satellite based applications, as well as in synchrotron facilities.

Deposition Apparatus

Figure 1:
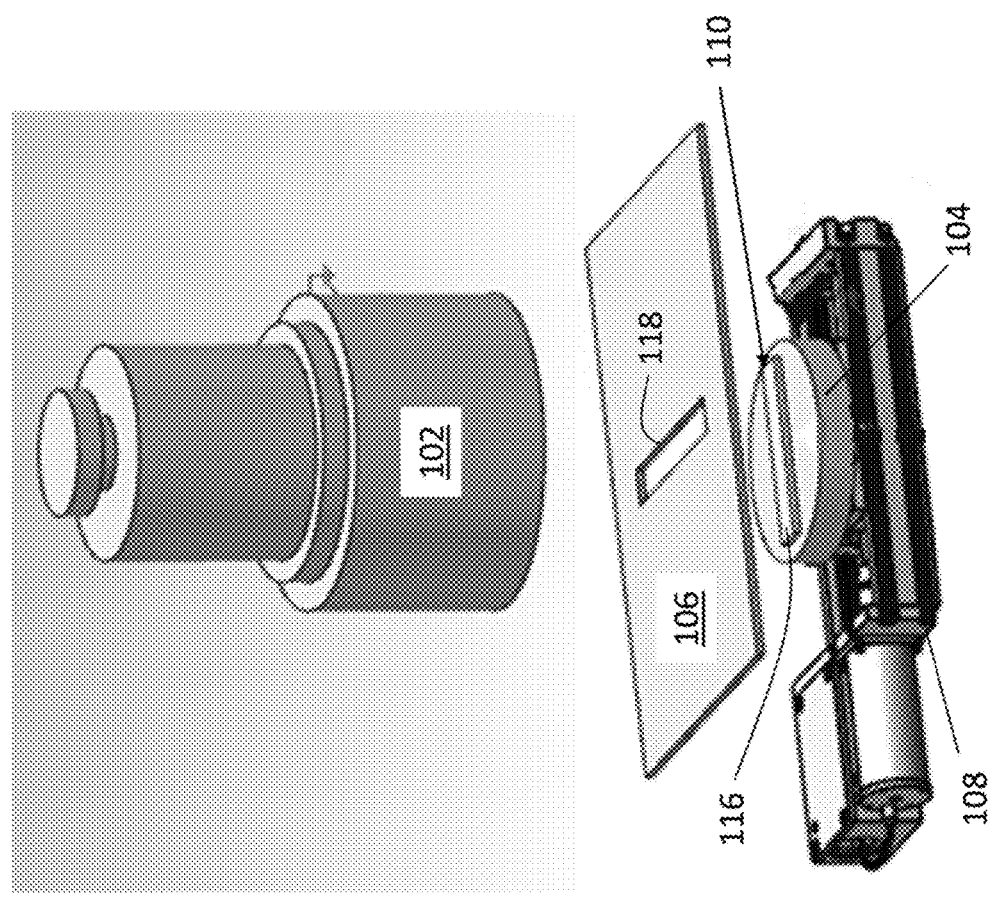
FIG. 1 shows a perspective view of a portion of a deposition apparatus according to an illustrative embodiment.
Figure 2:
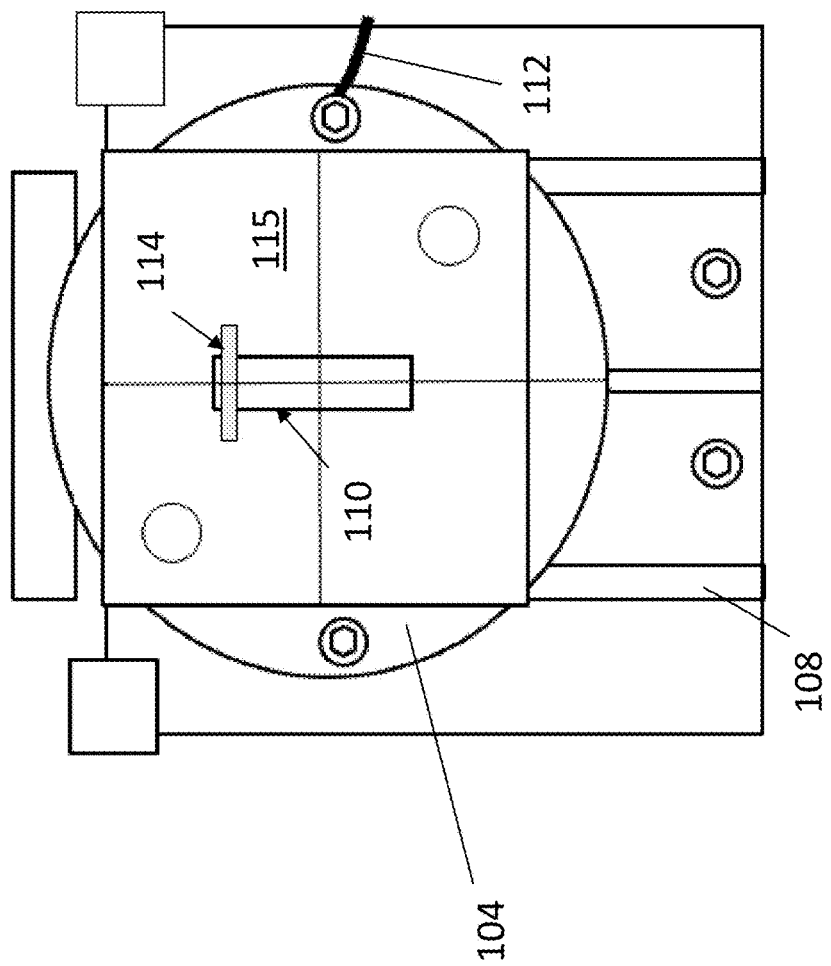
FIG. 2 shows a top view of another portion of the deposition apparatus of FIG. 1.

The deposition apparatus of the deposition system may be a sputtering deposition apparatus such as a DC magnetron sputtering apparatus. A portion of an illustrative DC magnetron sputtering apparatus 100 is shown in FIG. 1. A top view of another portion of the apparatus 100 is shown in FIG. 2.

The apparatus 100 includes a source 102, a sample holder 104, a mask 106, a translation stage 108, and a bias voltage power supply (not shown). The source 102 is configured to contain a coating material. Various coating materials may be used, provided the stress of the as-deposited coating material can be manipulated via the deposition conditions, e.g., via bias voltage as further described below. Illustrative coating materials include metals, including transition metals and alloys thereof, such as chromium, iridium, and nickel cobalt. The coating material may be a magnetic smart material, including those disclosed in X. Wang, P. Knapp, S. Vaynman, M. E. Graham, J. Cao, and M. P. Ulmer, "Experimental study and analytical model of deformation of magnetostrictive films as applied to mirrors for X-ray space telescopes," Appl. Opt. 53(27), 6256-6267 (2014); M. P. Ulmer, M. E. Graham, S. Vaynman, J. Cao, and P. Z. Takacs, "Magnetic smart material application to adaptive x-ray optics," Proc. SPIE 7803, 780309 (2010); and M. P. Ulmer, X. Wang, J. Cao, J. Savoie, B. Bellavia, M. E. Graham, and S. Vaynman, "Progress report on using magneto-strictive sputtered thin films to modify the shape of a X-ray telescope mirror," Proc. SPIE 8503, 85030C (2012), each of which is hereby incorporated by reference in its entirety. The coating material may be provided in a variety of forms, e.g., a solid form such as a rod or disc.

The sample holder 104 is configured to support an optical substrate 110. Various materials may be used for the sample holder 104, including conductive materials such as aluminum. The surface 116 of the optical substrate 110 is the surface on which the coating material is to be deposited to form the stress distributed coating layer. In some embodiments, the sample holder 104 may be configured to provide electrical conductivity between the surface 116 and the bias voltage power supply. This may be accomplished in a variety of ways. As shown in FIG. 2, this may be accomplished by a conductive tape 114 (e.g., composed of aluminum) in contact with a conductive plate 115 (in contact with the sample holder 104) and a surface 116 of the optical substrate 110 (also in contact with the conductive plate 115). This configuration of the sample holder 104 is not necessary, e.g., if the optical substrate 110 is conductive.

The mask 106 is positioned between the source 102 and the sample holder 104. The mask 106 is configured, e.g., by defining an aperture (e.g., slit 118) therein, to restrict the flux of the coating material from the source 102 to the surface 116 of the optical substrate 110. By "restrict" it is meant that the mask 106 results in the deposition of coating material on a smaller area than would be possible in the absence of the mask 106. Various shapes and dimensions may be used for the slit 118. The shape/dimensions may be selected based upon the geometry of the optical substrate 110 and the frequency of the stress distribution of the stress distributed coating layer to be applied. Various materials may be used for the mask 106, provided that the material is sufficiently resistant to heat so as not to melt during use. Illustrative materials include aluminum, stainless steel or PTFE.

The distance between the mask 106 and optical substrate 110 may be selected to ensure that approximately only that portion of the surface 116 underneath the slit 118 is exposed to the sputtered particle flux from the source 102. In this way, the coating material may be deposited at discrete regions on the surface 116. Together, the plurality of discrete regions having as-deposited coating material thereon (i.e., coating regions) provides a fully coated (or substantially fully coated) surface 116, i.e., the stress distributed coating layer on the surface 116. Depending upon the mask 106 configuration and the mask 106-to-optical substrate 110 distance, those coating regions may also vary in shape and dimension. The shapes and dimensions are not particularly limited. By way of illustration, the rectangular shape of the slit 118 modifies the sputtered particle flux from the source 102 into a line-shape, resulting in line-shaped coating regions.

It is noted that the mask 106 may be mounted to or otherwise integrated into the source 102 such that the functionality of the mask 106 (i.e., modification and restriction of particle flux) can be considered to be part of the functionality of the source 102. In addition, from the perspective of the optical substrate 110, the "source" of the sputtered particle flux may be considered to be the mask 106. However, this "source" is tunable, e.g., by adjusting the shape/dimensions of the slit 118. Thus, the mask 106 can be referred to as "a tunable source."

The distance between the source 102 and the optical substrate 110 may be selected to optimize (e.g., maximize) the deposition rate of the sputtered particle flux.

The sample holder 104 is mounted to the translation stage 108. The translation stage 108 is configured to move the sample holder 104 (and thus the optical substrate 110) relative to the source 102 and mask 106 at a selected translation rate. As it is the relative translation of the source 102/mask 106 and the optical substrate 110 that is relevant, other configurations which accomplish such relative translation may be used (e.g., the source 102/mask 106 may be translated relative to a stationary optical substrate). The translation stage 108 may be a component of a drive system configured to achieve such relative translation. In the illustrative embodiment, the translation stage 108 is configured to move in a single dimension, i.e., along they y axis. However, stages which provide movement in two or three dimensions may be used (i.e., xy movement or xyz movement). Stages capable of achieving different translation ranges may be used, depending upon the geometry of the optical substrate 110. The translation rate may be selected to provide a selected deposition time for a selected thickness of the stress distributed coating layer.

The bias voltage power supply is in electrical communication with the surface 116 of the optical substrate (e.g., via the wire 112 connected to the sample holder 104 and thus the conductive plate 115 and the conductive tape 114). The bias voltage power supply is configured to control and adjust the bias voltage between the sample holder 104 and the mask 106. As further described below, the range of bias voltages depends upon the coating material and the selected stress of a coating region.

The apparatus 100 may include additional components, e.g., those typically used with conventional DC magnetron sputtering apparatuses.

The apparatus 100 may be used to deposit coating material on a variety of optical substrates 110. The optical substrate 110 has a front surface, the surface which receives incoming light, and an opposing back surface. Illustrative optical substrates 110 include reflective substrates such as mirrors. Mirrors which are configured to reflect light of particular wavelength ranges may be used. For example, mirrors configured to reflect light having a wavelength in the X-ray portion of the electromagnetic spectrum (e.g., from about 10 pm to about 1 nm), the visible portion of the electromagnetic spectrum (e.g., from about 400 nm to about 700 nm), or the infrared portion of the electromagnetic spectrum (e.g., from about 1 μm to about 100 μm) may be used. For mirrors and other reflective substrates, the surface onto which the coating material is deposited (e.g., surface 116 in FIG. 1) is generally the non-reflective surface (which may be referred to throughout this disclosure as the "backside" of an optical substrate). The optical substrate 110 may be a replicated optical substrate by which it is meant an optical substrate formed using known replication processes such as electroforming, epoxy replication, slumping glass methods, and the like. For example, a glass mirror (e.g., composed of Schott D263T glass) formed using a slumping glass method may be used. Various thicknesses of the optical substrate 110 may be used, depending upon the application and the stresses in the stress distributed coating layer. However, the optical substrates are generally thin, e.g., having a thickness in the range of from about 100 μm to about 1 mm.

In some embodiments, the optical substrate to be coated has no other coatings thereon. For example, in some embodiments, the backside of the optical substrate to be coated is uncoated. In other embodiments, the backside of the optical substrate to be coated has been pre-coated, e.g., with another material. By way of illustration, the pre-coating may be formed from a magnetic smart material (MSM), which allows for additional adjustments of the surface profile of the optical substrate via magnetostriction. See, X. Wang, P. Knapp, S. Vaynman, M. E. Graham, J. Cao, and M. P. Ulmer, "Experimental study and analytical model of deformation of magnetostrictive films as applied to mirrors for X-ray space telescopes," Appl. Opt. 53(27), 6256-6267 (2014); M. P. Ulmer, M. E. Graham, S. Vaynman, J. Cao, and P. Z. Takacs, "Magnetic smart material application to adaptive x-ray optics," Proc. SPIE 7803, 780309 (2010); and M. P. Ulmer, X. Wang, J. Cao, J. Savoie, B. Bellavia, M. E. Graham, and S. Vaynman, "Progress report on using magneto-strictive sputtered thin films to modify the shape of a X-ray telescope mirror," Proc. SPIE 8503, 85030C (2012), each of which is hereby incorporated by reference in its entirety.

Figure 6:
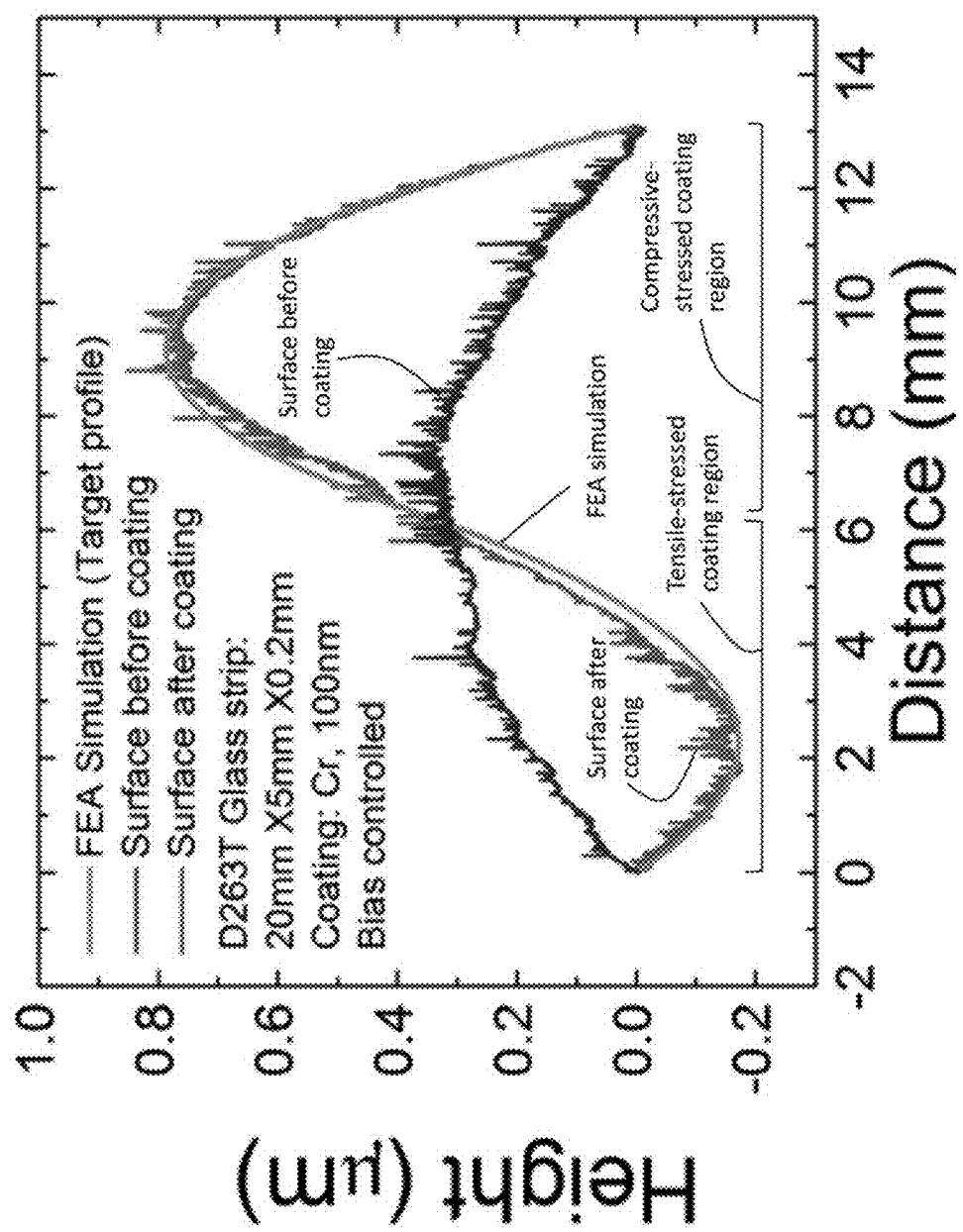
FIG. 6 shows the measured surface profile of a D263T glass strip before coating and after coating. The simulated surface profile of the coated glass strip is also shown.

An optical substrate to be coated may be characterized by a surface profile. The term "surface profile" generally refers to the contour of the surface of an optical substrate. As illustrated in FIG. 6, the surface profile can refer to a one-dimensional surface profile, i.e., the contour of the surface along a cross-section of an optical substrate, the cross-section taken perpendicular to the plane of the optical substrate. FIG. 6 shows the one-dimensional surface profile of an illustrative optical substrate, a rectangular glass strip, from a cross-section taken perpendicular to the plane of the strip and through the centerline of the strip in the longitudinal direction (refer to the yz plane in FIG. 1).

Figure 5:
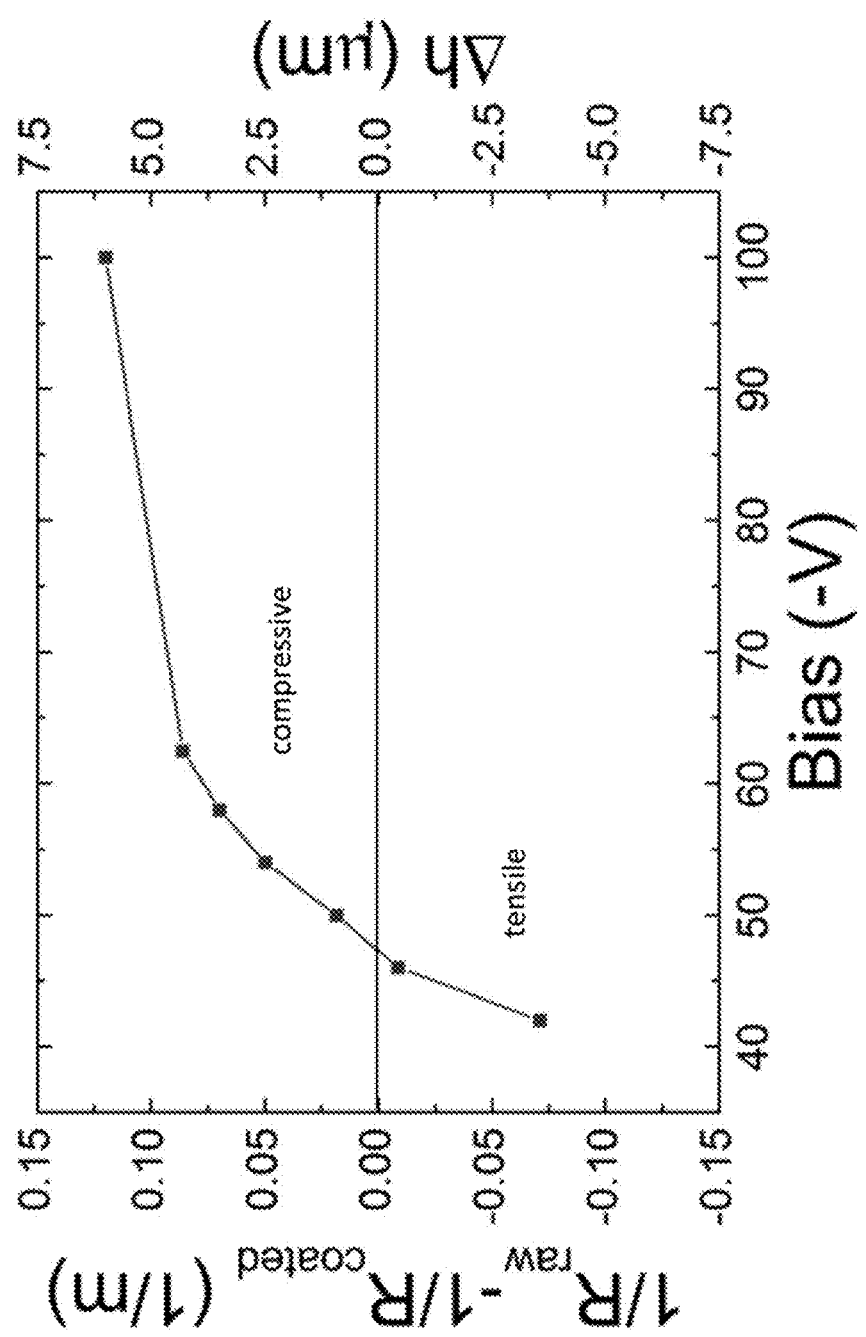
FIG. 5 shows a plot of the differences of curvatures (DOCs) versus the bias voltage obtained from samples coated using the deposition apparatus of FIG. 1.

As discussed further below, the stress produced an as-deposited coating material on the underlying optical substrate is a function of the bias voltage at which the coating material is deposited. Throughout this specification, the term "stress" or "stress value" can refer to the magnitude of the stress as well as the type of stress (e.g., tensile or compressive). This is illustrated in FIG. 5, which shows the difference of curvature (DOC, left axis) and the displacement (Δh) produced by a chromium coating on a rectangular glass strip as a function of the bias voltage at which the chromium was deposited. The DOC and displacement are proportional to the stress produced by the as-deposited chromium (in the case of FIG. 5, per Equations 1 and 2, below).

As described above, the apparatus 100 can deposit coating material in discrete regions on the surface of the optical substrate 110. Thus, by adjusting the bias voltage during the deposition, e.g., by using different bias voltages at different regions, a stress distributed coating layer may be deposited. The term "stress distributed" may be used to describe the coating layers formed using the disclosed systems and methods. Throughout this specification, the term "stress distributed" means that the stress produced by the coating layer varies as a function of position along the plane of the coating layer. The term "stress manipulated" may also be used interchangeably with "stress distributed."

The particular stress distribution depends upon the shape and dimensions of the coating regions and the bias voltages used to deposit the coating material to form those coating regions. By way of illustration, FIG. 6 shows the surface profile of a coating layer (labeled "surface after coating") including two coating regions, each coating region covering half of the rectangular glass strip, each coating region characterized by a different stress. The left coating region produces tensile stress; the right coating region produces compressive stress. Also illustrated is the shape change produced by the stress distributed coating layer (compare the surface profile of the rectangular glass strip before coating (labeled "surface before coating")). The stress distribution is a one-dimensional stress distribution in that the stress varies along one dimension, the longitudinal dimension of the rectangular glass strip (see y axis in FIG. 1). However, other stress distributions may be achieved. For example, a translation stage providing translation in two dimensions may be used to provide two-dimensional stress distributions. Moreover, as described above, the shape and dimensions of the coating regions may be adjusted, e.g., via the mask 106.

As noted above, and further described in the Example below, the stress produced by the stress distributed coating layer alters the surface profile of the underlying optical substrate. Thus, a particular stress distribution may be used to achieve a desired surface profile. By way of illustration, the surface profile of an optical substrate (e.g., a replicated optical substrate) may be an initial surface profile which deviates from a target surface profile (e.g., one ideal for a particular application). The stress distribution which corrects such deviations can be predetermined. Methods for arriving at such predetermined stress distributions will be further described below.

It is noted that the terms "discrete" and "regions" used throughout the specification is not meant to imply that the resulting stress distributions themselves are necessarily "discretized" (although they may be, in some embodiments). At least because the shape and dimensions of the coating regions are not particularly limited and because the bias voltage may be continuously adjusted during deposition, stress distributions in which variation of stress with position is continuous (or substantially continuous) can be achieved.

Deposition Methods

One embodiment of a method of using a deposition apparatus, e.g., apparatus 100, includes depositing a coating material at a first location on an optical substrate at a first bias voltage to provide a first coating region at the first location characterized by a first stress, and depositing the coating material at a second location on the optical substrate at a second bias voltage to provide a second coating region at the second location characterized by a second stress. Deposition of the coating material may continue at various additional locations on the optical substrate, at various bias voltages, to provide additional coating regions characterized by various stresses. The plurality of coating regions provides the stress distributed coating layer on the optical substrate. By using the method, at least two of the coating regions of the stress distributed coating layer are characterized by different stresses. If additional coating regions are deposited to form the stress distributed coating layer, each of the other coating regions may be characterized by a different stress. However, some of the coating regions may be characterized by the same stress.

In some embodiments, the bias voltages used at the various locations may be predetermined in order to provide a stress distributed coating layer having a predetermined stress distribution. The predetermined stress distribution/bias voltages can be those which reshape an initial surface profile of the optical substrate to a target surface profile. The reshaping can correct deviations in the initial surface profile from the surface profile which was intended during the manufacturing of the optical substrate. Methods for arriving at such predetermined stress distributions/bias voltages are further described below.

The deposition methods may include additional steps. After the deposition of an initial stress distributed coating layer, the surface profile of the coated optical substrate may be measured to determine whether the target surface profile has been achieved. If it has not been achieved, additional coating material may be deposited as needed, optionally, by first removing the initial stress distributed coating layer (or coating regions thereof).

Determination of Stress Distribution and Bias Voltage Value Distribution

Figure 12:
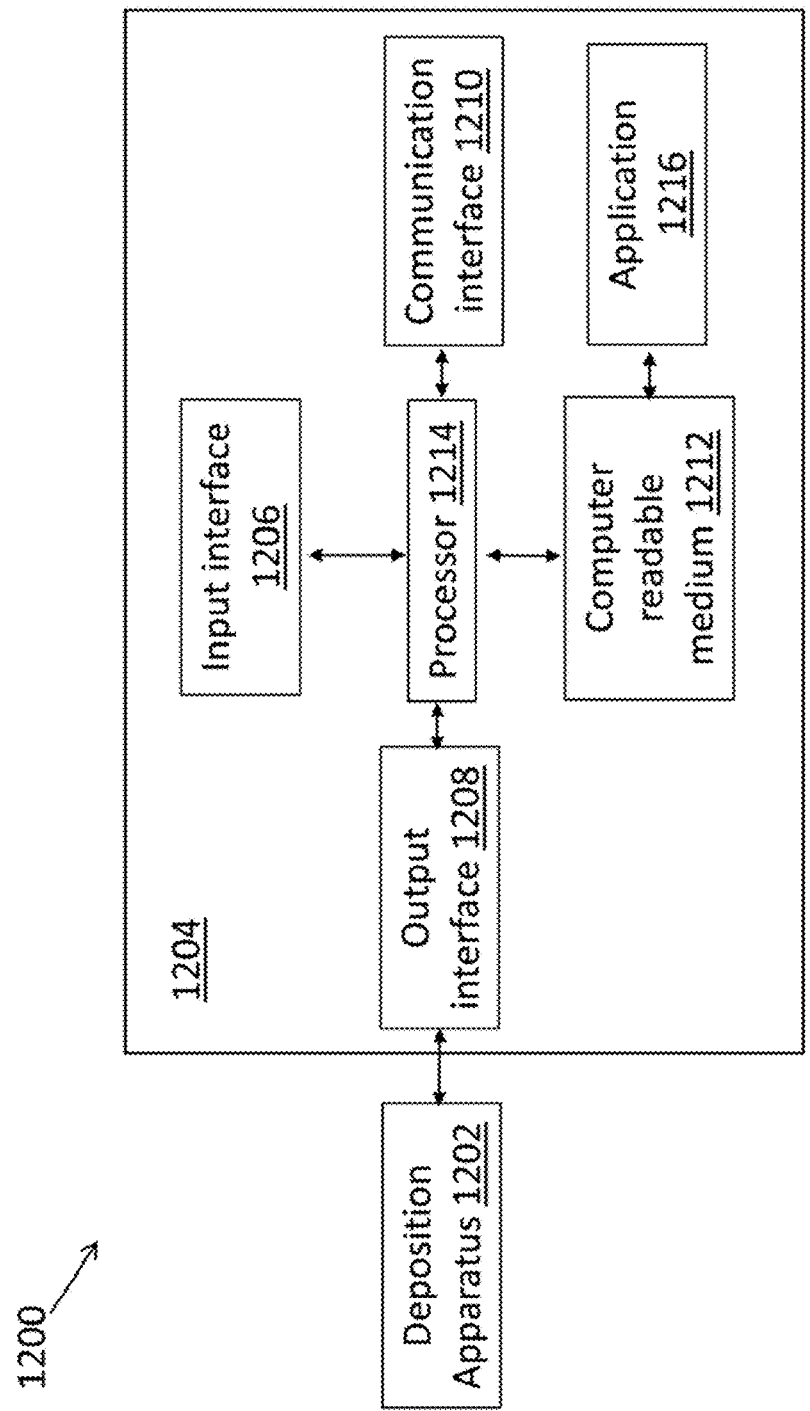
FIG. 12 shows a deposition system including a deposition apparatus and a computing device according to an illustrative embodiment.

As shown in FIG. 12, a deposition apparatus 1202 (e.g., apparatus 100) may be a component of a deposition system 1200 which includes a computing device 1204. The computing device 1204 may be configured to determine a stress distribution and an associated bias voltage value distribution for depositing a stress distributed coating layer, e.g., according to the deposition methods described above.

The deposition apparatus 1202 and the computing device 1204 may be integrated into a single device or their functionality may be distributed across one or more devices that are connected directly or through a network that may be wired or wireless. A database (not shown), a data repository for the deposition system 1200, may also be included in the deposition system 1200 and operably coupled to the computing device 1204.

The computing device 1204 may also be configured to control at least some of the operations of the deposition apparatus 1202. For example, the computing device 1204 may be operably coupled to the bias voltage power supply and the translation stage 108 in order to control these components during deposition.

As shown in the illustrative embodiment, the computing device 1204 may include an input interface 1206, an output interface 1208, a communication interface 1210, a computer-readable medium 1212, a processor 1214, and an application 1216. The computing device 1204 may be a computer of any form factor including an electrical circuit board integrated into the deposition apparatus 1202.

Input interface 1206 provides an interface for receiving information into the computing device 1204. Input interface 1206 may interface with various input technologies including, e.g., a keyboard, a display, a mouse, a keypad, etc. to allow a user to enter information into the computing device 1204 or to make selections presented in a user interface displayed on the display. Input interface 1206 further may provide the electrical connections that provide connectivity between the computing device 1204 and the deposition apparatus 1202.

Output interface 1208 provides an interface for outputting information from the computing device 1204. For example, output interface 1208 may interface with various output technologies including, e.g., the display or a printer for outputting information for review by the user. Output interface 1208 may further provide an interface for outputting information to the deposition apparatus 1202, e.g., the bias voltage power supply and the translation stage 108.

Communication interface 1210 provides an interface for receiving and transmitting data between devices using various protocols, transmission technologies, and media. Communication interface 1210 may support communication using various transmission media that may be wired or wireless. Data and messages may be transferred between the computing device 1204, the deposition apparatus 1202, the database, and/or other external devices using communication interface 1210.

Computer-readable medium 1212 is an electronic holding place or storage for information so that the information can be accessed by the processor 1214. Computer-readable medium 1212 can include any type of random access memory (RAM), any type of read only memory (ROM), any type of flash memory, etc. such as magnetic storage devices, optical disks, smart cards, flash memory devices, etc.

Processor 1214 executes instructions. The instructions may be carried out by a special purpose computer, logic circuits, or hardware circuits. Thus, processor 1214 may be implemented in hardware, firmware, or any combination of these methods and/or in combination with software. The term "execution" is the process of running an application or the carrying out of the operation called for by an instruction. The instructions may be written using one or more programming language, scripting language, assembly language, etc. Processor 1214 executes an instruction, meaning that it performs/controls the operations called for by that instruction. Processor 1214 operably couples with input interface 1206, with output interface 1208, with computer-readable medium 1212, and with communication interface 1210 to receive, to send, and to process information. Processor 1214 may retrieve a set of instructions from a permanent memory device and copy the instructions in an executable form to a temporary memory device that is generally some form of RAM.

Application 1216 performs operations associated with calculating a stress distribution and an associated bias voltage value distribution for depositing a stress distributed coating layer using deposition apparatus 1202. Some or all of the operations described in this specification may be controlled by instructions embodied in the application 1216. The operations may be implemented using hardware, firmware, software, or any combination of these methods. With reference to the illustrative embodiment of FIG. 12, application 1216 is implemented in software (comprised of computer-readable and/or computer-executable instructions) stored in computer-readable medium 1212 and accessible by the processor 1214 for execution of the instructions that embody the operations of application 1216. Application 1216 may be written using one or more programming languages, assembly languages, scripting languages, etc.

Figure 13:
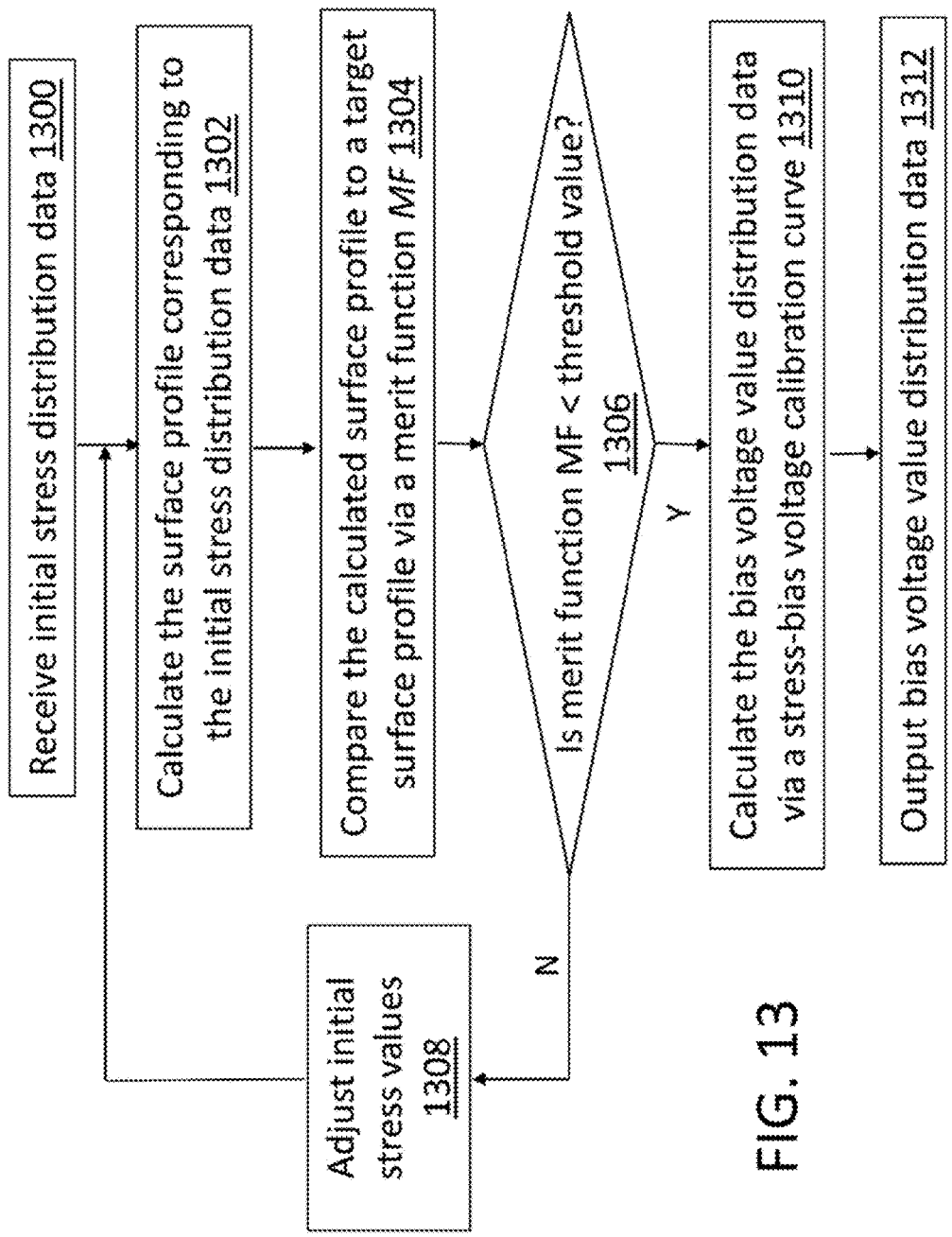
FIG. 13 shows illustrative operations associated with an application of the computing device of the deposition system of FIG. 12.

With reference to FIG. 13, illustrative operations associated with application 1216 are described according to an illustrative embodiment. Additional, fewer, or different operations may be performed depending on the embodiment. The order of the operations is not intended to be limiting. Thus, although some of the operational flows are presented in sequence, the various operations may be performed in various repetitions, concurrently, and/or in other orders than those that are illustrated.

In an operation 1300, initial stress distribution data are received for processing by processor 1214. The initial stress distribution data includes a set of initial stress values and associated location values. The location values represent particular positions or regions on the surface of the optical substrate to be coated. Thus, the location values may be individual points or a set of multiple points defining an area on the surface of the optical substrate. The initial stress distribution data may be data, for example, which is input by a user via the input interface 1206 or data which is received by reading from computer-readable medium 1212 or the database (e.g., via the communication interface 1210).

Figure 7:
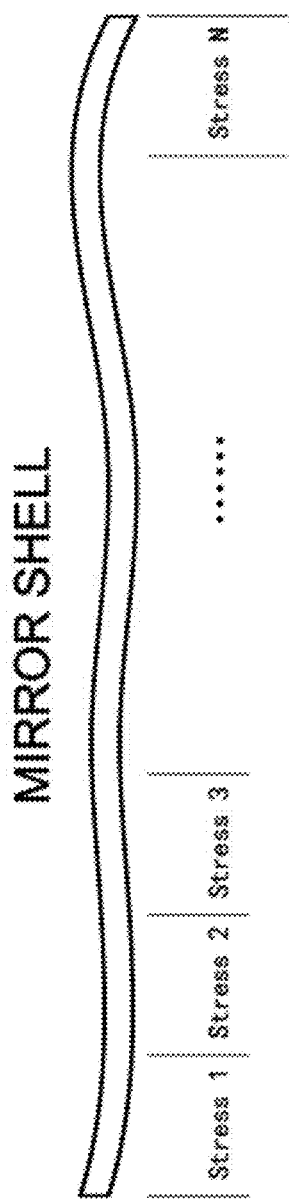
FIG. 7 shows a schematic of the discretization of a mirror and stress produced by a coating on the backside (non-reflective surface) of the mirror.

The initial stress distribution data may be generated as follows. The profile of the optical substrate (i.e., the initial surface profile) can be measured, e.g., via commercially available surface profilers. The optical substrate, and thus, its initial surface profile can be considered to be divided into N segments. As with the coating regions described above, the shape and size of the segments may vary. By way of illustration, for a one-dimensional initial stress distribution, parallel lines can be used to divide the surface of the optical substrate into a plurality of rectangular segments. For a two-dimensional initial stress distribution, a grid of lines can be used to divide the surface of the optical substrate into a plurality of square segments. Various values of N may be used, which may be selected depending upon the frequency of the waviness of the initial surface profile of the optical substrate to be coated. By way of illustration, FIG. 7 shows the cross-section of an optical substrate which has been divided into N rectangular segments. The longitudinal dimension of the optical substrate is in the plane of the page. Each segment is associated with a particular location value which identifies its position within the optical substrate.

Similarly, the target surface profile of the optical substrate can be similarly divided into N segments. The target surface profile may be any surface profile which is desired for the optical substrate, e.g., a surface profile which was intended during manufacture of the optical substrate.

Next, the difference in curvature (DOC) between the initial surface profile and the target surface profile can be calculated for each of the N segments from $$DOC \equiv \frac{1}{R_{initial}} - \frac{1}{R_{target}}.$$

Next, an initial stress value associated with the calculated DOC for each segment can be calculated (since DOC is proportional to stress). The initial stress value can be calculated from an equation that defines the relationship between the DOC and the stress (e.g., see Equation 1, below, which applicable for spherical segments). The result of this calculation is a set of initial stress values and associated location values, i.e., the initial stress distribution data.

It is to be understood that the generation of the initial stress distribution data itself may be performed by operations associated with application 1216 which can involve, e.g., first inputting the initial surface profile of the optical substrate to be coated and the target surface profile by a user via the input interface 1206; or by reading such profiles from the computer-readable medium 1212 or the database; or by streaming such profiles from some other external device via the communication interface 1210.

The initial stress distribution data can be considered to be an initial estimate which may be subsequently adjusted via additional operations to provide optimized stress distribution data, i.e., a set of optimized stress values and associated location values. In particular, with reference back to FIG. 13, in an operation 1302, the surface profile corresponding to the initial stress distribution data can be calculated.

Next, in an operation 1304, the calculated surface profile can be compared with the target surface profile via a merit function MF (see Equation 3, below). In Equation 3, M can be considered to be a particular segment of the N segments and $x_i$ can be considered to be a location value.

Next, in an operation 1306, a determination is made concerning whether or not the calculated MF is greater than a particular threshold value. If the calculated MF is greater than the particular threshold value, processing continues in an operation 1308 to adjust the initial stress values of the initial stress distribution data to provide adjusted stress distribution data. Operations 1302 and 1304 can be repeated to calculate an adjusted surface profile corresponding to the adjusted stress distribution data and to recalculate MF, respectively. As described in the Example below, the commercially available element code ABAQUS can be used for the surface profile calculations and the MF calculations. The commercially available optimization software ISIGNT can be used for the adjustment/optimization of stress values. If the calculated MF is less than the threshold value, optimized stress distribution data has been achieved and processing can continue in an operation 1310.

As described in the Example, below, an approach may be taken in which the initial surface profile is taken to be the desired, target surface profile so that the optimized stress distribution data is that which conforms to the actual (i.e., measured) surface profile of the optical substrate to be coated. Then, the sign of the stress values in the optimized stress distribution data is reversed prior to calculating the bias voltage value distribution data in the operation 1310.

Next, in operation 1310, bias voltage value distribution data can be calculated from the optimized stress distribution data using a stress-bias voltage calibration curve. This calibration curve may be predetermined through measurements of DOC at various bias voltage values for a selected optical substrate material, coating material, and other deposition conditions. By way of illustration, FIG. 5 shows the relationship between DOC and bias voltage for a D263 Schott glass optical substrate, chromium coating material, and the deposition conditions described in the Example, below. Since DOC is proportional to stress, e.g., via Equation 1, the DOC-bias voltage calibration curve can be converted to a stress-bias voltage calibration curve so that bias voltage values can be calculated from inputted stress values (e.g., those inputted from the optimized stress distribution data). Calibration curve data may be made available, e.g., by user input via the input interface 1206; by reading from the computer-readable medium 1212 or the database; or by streaming from some other external device via the communication interface 1210. The result of operation 1310 is the bias voltage value distribution data, the set of bias voltage values and associated location values to be used during the deposition methods to provide the stress distributed coating layer.

In operation 1312, the bias voltage value distribution data can be output, e.g., via the output interface 1208, which may be operably coupled to the deposition apparatus. As described above, the output may be provided to the bias voltage power supply and the translation stage in order to set, control, and coordinate the bias voltage values and the location of the translation stage during deposition. Actual deposition of the stress distributed coating layer may be accomplished via the method described above, in which the bias voltages and locations referenced in the methods, and the number of depositions steps are determined by the corresponding bias voltage values and location values in the bias voltage value distribution data.

As noted above, FIG. 13 is merely illustrative. For example, embodiments in which a separate processor executes operations associated with determining the initial stress distribution data and another separate processor executes operations associated with determining the optimized stress distribution data may be used. The optimized stress distribution data may be received by processor 1214 for execution of operations 1310 and 1312.

It is noted that devices including processor 1214, the computer-readable medium 1212 operably coupled to the process 1214, the computer-readable medium 1212 having computer-readable instructions stored thereon that, when executed by the processor 1214, cause the device to perform any of the operations described above (or various combinations thereof) are encompassed by the disclosure. The computer-readable medium 1212 is similarly encompassed.

Coated Optical Substrates

The disclosure also encompasses the coated optical substrates themselves. The optical substrates and coating materials may be any of those described above. The coating layer on the surface of the optical substrate may be characterized by an average thickness. By "average thickness" it is meant an average value across the surface of the optical substrate. However, the coating layer thickness may be substantially uniform in that the deviation of the thickness across the surface of the optical substrate from the average thickness value is quite small, e.g., within ±10%, ±5%, ±2%, ±1%, etc. Different average thicknesses may be used, depending upon the application. Suitable average thicknesses include those in the range of from about 50 nm to about 500 nm, 50 nm to about 200 nm, or about 100 nm. Although the coating layer thickness may be substantially uniform, as described above, the distribution of stress produced by the coating layer is typically non-uniform.

The coating layer may be a single layer (as distinguished from multilayer coatings). The front side of the optical substrates may be uncoated.

EXAMPLE

Introduction

This Example presents a method to correct the surface profile of an X-ray mirror by using a stress manipulated coating on the back side of mirror shells. The ability to fabricate a thin walled mirror by some replication process is required if future affordable X-ray space missions are to have ~30 times the effective area of the current best X-ray observatory, i.e., the Chandra X-ray Observatory (CXO). Thus, some process is necessary for using replicated X-ray optics to make the next generation X-ray observatory. However, although the surface roughness of sub-100 μm length scales can be replicated, no known replication technique can make 1 arc-second or better CXO-like optics. Yet, because the images produced by the CXO are so exquisite, many X-ray astronomers are not willing to settle for less in the future. Therefore, a post replication technique must be developed to make future major X-ray astronomy missions possible. In this Example, a post replication technique based on DC magnetron sputtering is described. For figure correction, a controlled bias voltage on the surface is applied during the sputtering. This Example demonstrates the achievement, in 1-D, shape changes large enough (1 μm over 10 mm) to correct the typical figure errors in replicated optics. Reproducibility is demonstrated on an on an order of 0.6%, and stability over weeks is demonstrated on a scale of less than 1 μm over 10 mm. For these tests, 200 μm thick pieces of D263 Schott glass were used, of about 5 mm (width)×20 mm (length). In addition to the basic concept of controlling the stress with the coating, a new optimization software design is described to calculate the stress distribution for a desired surface profile. It is shown that the combination of the stress optimization software coupled with the coating process can reduce the slope error of a 5 mm×20 mm glass sample by a factor of ten.

Process

A portion of an illustrative DC magnetron sputtering apparatus 100 is shown in FIG. 1, as described above. The concept is to modify the stress during deposition by controlling a voltage bias between the sample holder 104 and the mask 106. In this manner, a figure correction with stress can be produced by synchronizing the bias voltage with the location of a translation stage 108. The process of changing the bias while applying the coating on the back side of the mirror is different from conventional methods which utilize monolithic multilayer deposition over an entire test mirror. (See K. Chan, W. W. Zhang, D. Windt, M. Hong, T. Saha, R. McClelland, M. Sharpe, and V. H. Dwivedi, "Reflective coating for lightweight X-ray optics," Proc. SPIE 8443, 84433 S (2012)).

Process Design

FIG. 1 also illustrates the design of the coating setup using a 2 inch diameter sputter Cr source 102, produced by AJA Co. Chromium (Cr) was selected as the coating material due to its low cost and availability. Additionally, Cr coatings can produce a wide range of stresses from tensile to compressive with the variation of negative bias voltage. (See H. Windischmann, "Intrinsic stress in sputter-deposited thin films," Crit. Rev. Solid State Mater. Sci. 17(6), 547-596 (1992), which is hereby incorporated by reference in its entirety.) Chromium is also an ideal binding layer as the adhesive force between the Cr and the substrate is good. The translation stage 108 used was manufactured by Zaber (T-LSM050-SV). The stage 108 had a motion range of 50 mm and an adjustable motion speed as high as 12 mm/sec.

In the experiments reported here, a combination of a 4 mm width slit 118 on the mask 106 was used and the motion speed was fixed to 0.022 mm/sec, i.e., a travel time over the 4 mm slit width of 3 min. The distance between the source 102 and the sample 110 was set at 90 mm, and the mask 106 to sample 110 gap to 2 mm. Thus, with the small mask 106-substrate 110 gap, the coating area was well defined by the slit 118 location. Further, the sample holder 104 was connected with the bias power supply to modulate the bias manually between 0 V and −100 V. The sample 110 used was a 20 mm×5 mm×0.2 mm glass strip (D263). During the coating process, a constant power of 100 W was applied to the sputter target and the pressure of Argon gas was set to 3±0.1 mTorr. With these settings, a Cr layer having uniform thickness (100 nm) but non-uniform stress having a desired local stress distribution was produced.

Repeatability Test

The Metrology

Before advancing to making improvements to the figure, the repeatability of the process was demonstrated by coating five samples. Therefore, easily measurable shape deformations were made. In order to describe the shape analytically, both the original and the final shape were approximated by a spherical profile. In that case, then the difference of curvature (hereafter, DOC) follows Stoney's Equation (Equation 1). (See G. G. Stoney, "The tension of metallic films deposited by electrolysis," Proc. R. Soc. Lond., A Contain. Pap. Math. Phys. Character 82(553), 172-175 (1909), which is hereby incorporated by reference in its entirety.)

$$DOC \equiv \frac{1}{R_{raw}} - \frac{1}{R_{coated}} = \frac{-6(1-v)}{Eh_s^2} t_f \sigma \qquad (1)$$

where, $R_{raw}$ and $R_{coated}$ are the radius of curvature before and after coating, v and E are the substrate's Poisson's ratio and Young's modulus, respectively, $h_s$ is the substrate thickness, $t_f$ and $\sigma$ stand for the thickness and stress of the coated film, respectively. The DOC was used characterize the stress because the DOC is proportional to the stress since $t_f$ is fixed at 100 nm. Additionally, the DOC directly illustrates the deformation of the sample, since the glass substrate has an initial convex radius of curvature of about 10-100 m. Finally, the DOC can be easily measured by a profiler.

For X-ray optics, of interest is the slope change of the figure, as the deviation of the X-rays is affected by the reflecting grazing angle. Therefore, the DOC is converted to an angle $\Delta\theta$ by Equation 2. $\Delta\theta$ is the slope change. As defined in Equation 1, $R_{raw}$ and $R_{coated}$ are the radius of curvature before and after coating, respectively. $\Delta h$ is the displacement corresponding to the slope change, and l is the length over which $\Delta\theta$ occurs. For an l=20 mm long piece, the slope change of angle 0.0004 radians corresponds to a DOC of 0.08/m.

$$\Delta\theta = \frac{2\Delta h}{l} \approx \frac{1}{4}\left(\frac{1}{R_{raw}} - \frac{1}{R_{coated}}\right) \qquad (2)$$

The curvature of the sample was measured before and after coating with a Veeco Dektak 150 stylus profiler. When measuring, the contact force on the sample was set to 1 mg, which is negligible in terms of the stress caused deformation of the sample surface. Note that the present experiment was focused on improving the 1-D surface profile along the length of the sample because the slope error parallel to the optical axis dominates the point spread function of an X-ray mirror. Thus, the 1-D measurements reported here were made with Veeco Dektak 150 along the centerline of the length of the glass strips.

Details of the Setup

The primary purpose of this work is to report on a new method of adjusting a 1-D surface profile. For completeness, it is noted that an important part of the illustrative sputtering system was the Al tape 114 shown in FIG. 2, which shows a top view of another portion of apparatus 100. Components shown include are the translation stage 108, the sample holder 104 and the sample 110. The Al tape 114 used was 0.1 mm thick and overlapped the sample 110 at one side in order to establish electrical conductivity. At the same time, the Al tape 114 was narrow enough (1 mm) so as not to introduce a measurable shape change to the sample. The glass strip (sample 110) was placed on a 50 mm×50 mm×2 mm Al plate 115 outside of the coating chamber. After the sample 110 was bonded to the Al plate 115 via the tape 114, the combination was placed onto the round sample holder 104. This design allowed the application of a bias voltage to the surface of the sample 110 via the wire 112.

Figure 3:
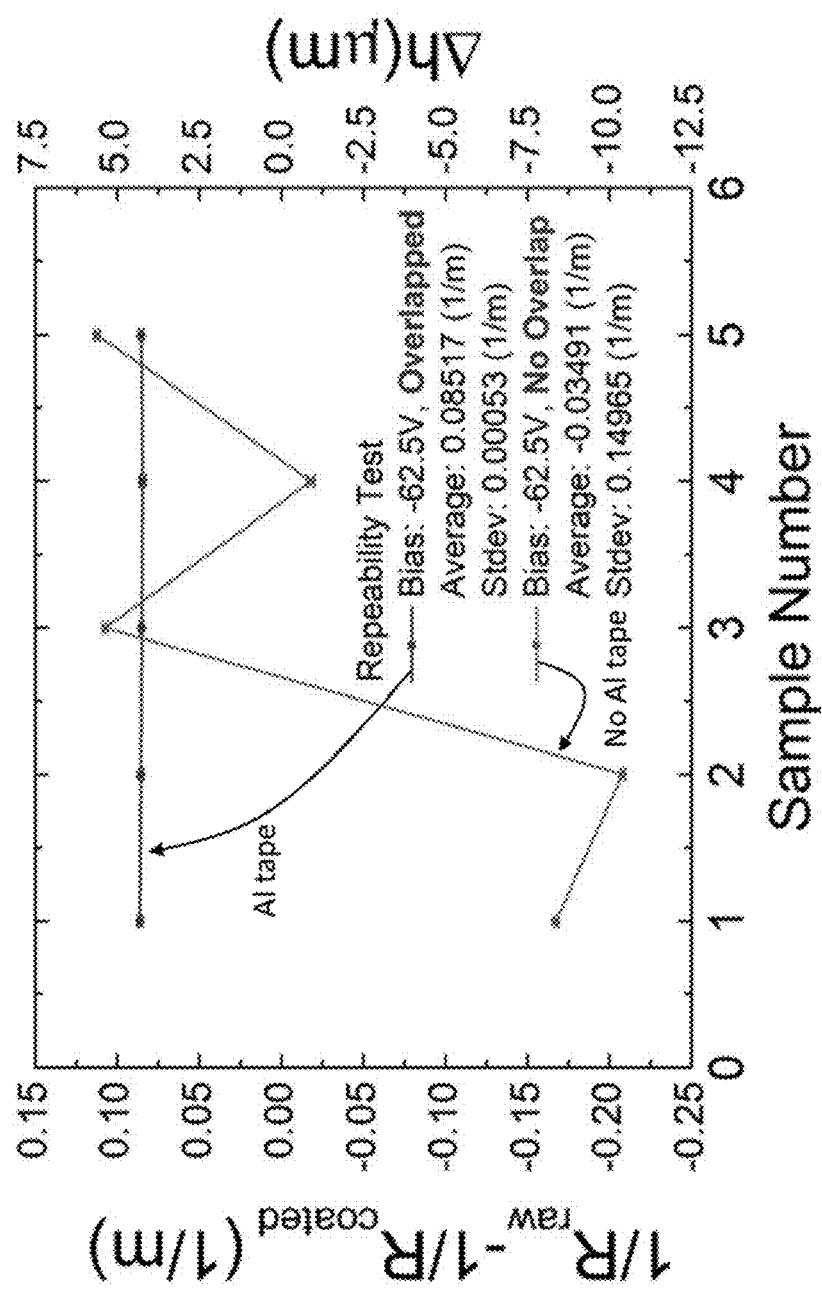
FIG. 3 shows the results of repeatability tests using the deposition apparatus of FIG. 1.

In order to demonstrate that the role of the Al tape 114 in this process, five sample were coated with and five samples without the Al tape 114. As shown in FIG. 3, it was found that the variation of the DOC for the two groups of samples was quite different for the two setups. For the Al taped samples, the variation of the DOC was less than 0.6%, whereas without the Al tape, variations of over 200% were obtained. The difference of the DOC between the two cases is attributed to the Al tape 114 providing the additional electrical conductivity.

To understand why the Al tape connection made a significant difference, the semi-transparent nature of the coating was exploited. The samples coated with and without the Al tape connection were placed under light to observe the coating thickness. For the samples without the Al tape connection, clear white stripes were observed, whereas no such stripes were visible for the samples with the Al tape connection. From the brightness variations on the samples without the Al tape connection, it was estimated that the transmittance varied as much as from 5% to 35% along the length of the samples. Without wishing to be bound to a particular theory, this effect is explained as being due to static charge buildup occurring in the absence of the Al tape connection. The connection between two metal conductors, the Cr coating and the sample holder 104 could attenuate the space charge near the sample surface. Thus, the observable white stripe bleaching effect in coated samples may result from the mask 106 window, and the bias at the surface deviating from the setting on the bias power supply.

FIG. 3 shows the relatively large variations in the DOC without Al tape connection versus that with Al tape connection. Since the measured length of these samples was 13 mm, a Δh of 0.1 μm corresponds to 0.1 E-6/13 E-3=7 E-6 radians or about 1.6 arc-seconds. This value of 1.6 arc-seconds is close to the target of 1 arc-second. Overall, it is estimated that the procedure with the Al tape 114 reduces unwanted deformations on the glass samples by a factor of over 160.

Stability Test

Figure 4A:
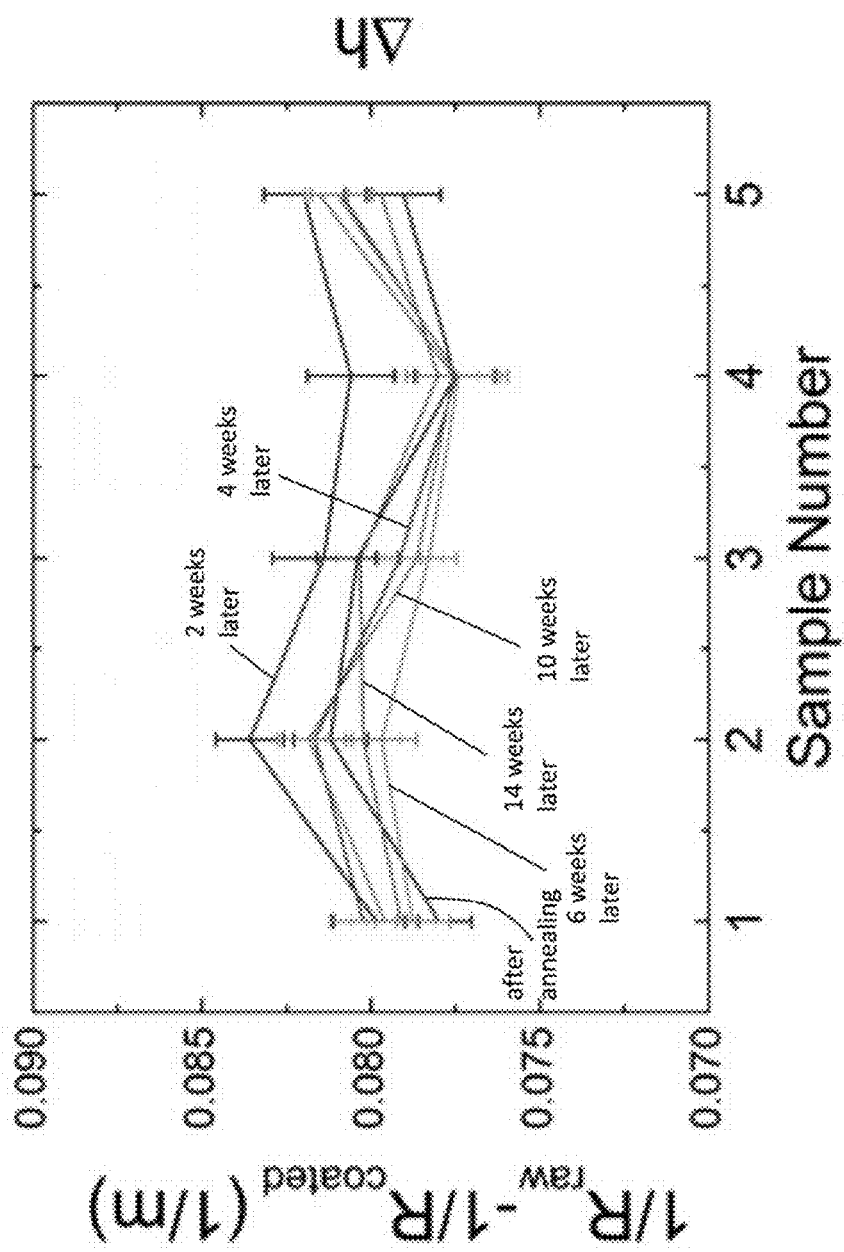
FIG. 4A shows the evolution of five coated samples' differences of curvatures (DOCs) over 14 weeks. The samples were coated using the deposition apparatus of FIG. 1. The curvatures before ($1/R_{raw}$) and after ($1/R_{coated}$) coating were measured by a Veeco Dektak 150 stylus profiler.
Figure 4B:
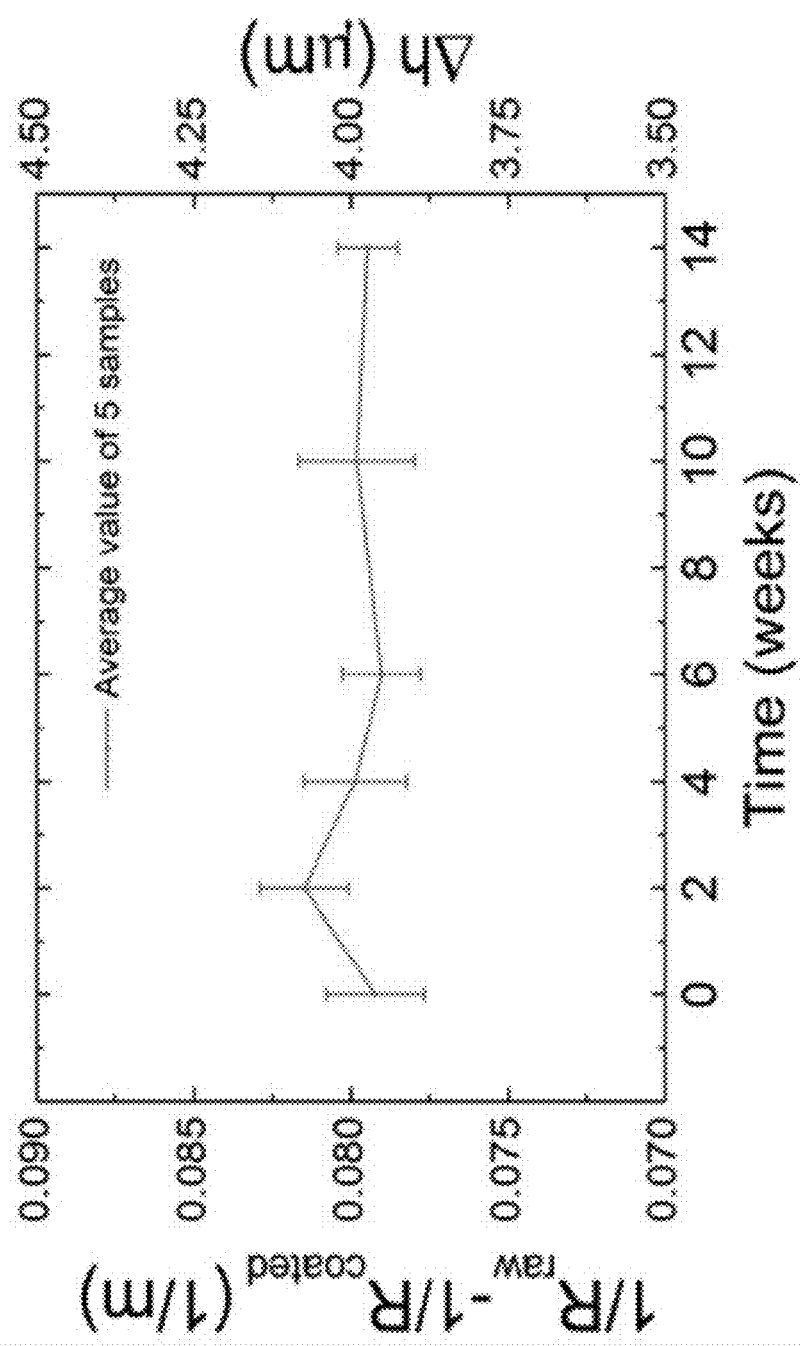
FIG. 4B shows the average and the standard deviations of the five coated samples at various time periods.

As the goal is a stable surface figure, after carrying out a particular shape modification, changes in shape over time were monitored. Specifically, the shape of the test samples was monitored by continuously measuring the DOCs as was done in FIG. 3 (with Al tape connection). The results are shown in FIGS. 4A-4B. Stability tests were created whereby first, the five samples coated via Al tape connection were annealed (70° C., 5 hrs) within hours of the initial coating to accelerate the stress relaxation, similar to what was reported in B. Chalifoux, E. Sung, R. K. Heilmann, and M. L. Schattenburg, "High-precision figure correction of X-ray telescope optics using ion implantation," Proc. SPIE 8861, 88610T (2013). Next, the samples were kept under vacuum (3 mTorr) to prevent oxidization, and then the DOCs of the separate samples were monitored over time (see FIG. 4A). Each sample was exposed to air for only about 1 hr per measurement.

Before and after annealing, there was a measurable variation in the DOCs of the individual samples. Without wishing to be bound by a particular theory it is thought that the variations may be due to a temperature gradient in the particular annealing system used. Other annealing systems may be used to improve the temperature uniformity.

Using the current annealing system, the DOCs were monitored over the course of 14 weeks. It was found that the DOCs of the individual samples changed within a small range of ≤2.5%. In order to visualize this small effect, the average value of the DOC versus time was plotted on an expanded scale as shown in FIG. 4B. The error bars denote the variation in the values of the DOCs of the 5 samples. From the data in FIG. 4B, it is concluded that the stress modified shape can be locked in for periods as long as 14 weeks after the deposition. Then, referring back to the "Repeatability test" section, above, the variation in the average DOC over time shown in FIGS. 4A-4B corresponds to a Δh of about 0.004 mm/m or 4 E-6 radians or about 1 arc-second. Also as noted above, this value is close to the goal of maintaining a slope stability of about 1 arc-second (4.85 E-6 radians).

Calibration Process

In this section, the use of voltage bias to bring about a specific controlled shape change is discussed. A series of tests were carried out on 7 more samples. These samples were coated with the Al tape connection described above. Coatings were made as uniform as possible (to better than 2% based on the transparency measurements). Coatings were obtained with biases of −42 V, −46 V, −50 V, −54 V, −58 V, −62.5 V and −100 V. The resulting DOCs are shown in FIG. 5.

It can be seen that with increasing negative bias, the DOC varies from negative to positive, which means the stress can be manipulated from tensile to compressive. The dependence of DOC on bias shown in FIG. 5 can be combined with the repeatability tests described above. From this work, it is concluded that in 1-D, desired and stable shape changes can be achieved on 200 μm thick Schott D263 glass.

Preliminary Results of Stress Manipulation

In this section, a predictable 1-D shape change was produced to compare with data used as input for a finite element analysis (FEA). This test demonstrates that with initial metrology of a figure, a coating process and coating can be used to correct the figure. In the test, for the first half of the coating the bias was set to −42 V, which produced a DOC of about −0.071/m. In the second half, the bias was manually switched to −58V to produce a DOC of about 0.07/m. FIG. 6 shows the height converted to a sinusoidal profile. The initial surface profile is labeled ("surface before coating").

The results displayed in FIG. 6 were used as the data for an FEA model built in COMSOL Multiphysics to calculate a theoretical smooth surface profile. The FEA model used in COMSOL was set up as a 0.2 mm flat glass substrate with a 100 nm Cr coating on the top. Then the chromium layer was divided into two regions for different stress setups. Considering the raw glass substrate has a default convex curvature of 69 m as shown in FIG. 6, the corresponding initial compressive stress was calculated to be 88.9 MPa using Equation 1. In addition, considering that the produced DOC of 0.07/m corresponds to a stress of 430 MPa, it was determined that the stress on the left side of the sample was set to be a tensile stress of 341.1 MPa (=430 MPa−88.9 MPa). On the right side, the stress was set as a compressive one of 518.9 MPa (=430 MPa+88.9 MPa).

The FEA simulation is shown in FIG. 6, which is consistent with the measured one.

Numerical Optimization of the Stress Distribution and the Fabrication Result

Although Stoney's equation can predict the stress in coating on a spherical surface by means of the difference of curvature (DOC), it is not applicable for aspherical surfaces. In fact, typical mirror shells for X-ray telescopes are designed to be parabolic and hyperbolic. Thus, a numerical optimization process was developed to derive a desired stress distribution in coating which could reshape the mirrors to the targeted aspherical profile. The long dimension of the mirror is being corrected in this Example. The approach involves replacing a continuous stress distribution with finely spaced discrete steps. As is shown in FIG. 7, it is assumed that the stress within each region (i.e., segment) is uniform to correct the local shape. The combination of these discrete stresses leads to a designed global change of the surface due to the compliance and continuity of the surface. Therefore to carry out the calculation, discrete stresses were used as parameters that were adjusted by an algorithm to produce the desired result.

Note that the discrete number N is determined by the frequency of the waviness of the initial mirror sample. In this Example, N was fixed at 10 because the current waviness of the sample was of such a low frequency that 10 distinguished regions were enough to compensate the shape distortion.

Figure 8:
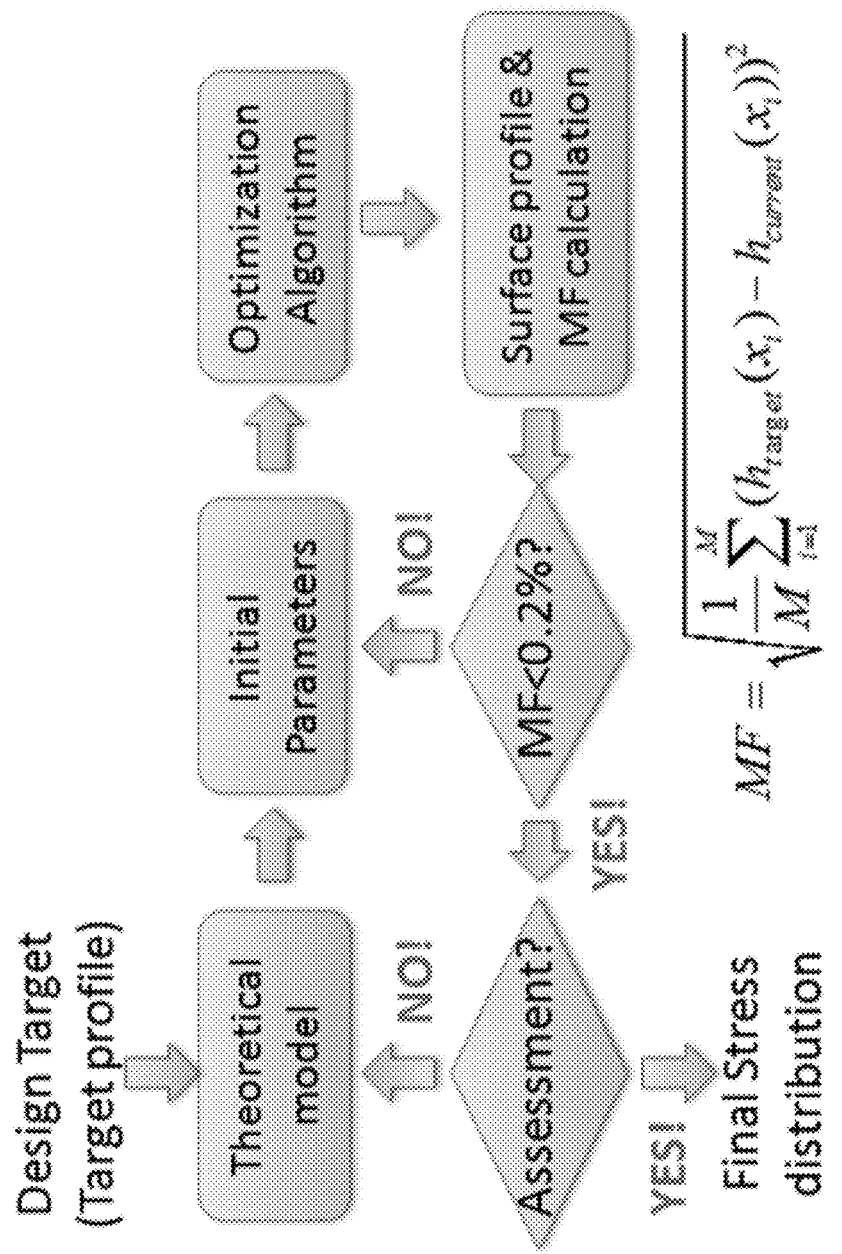
FIG. 8 shows a schematic diagram of an optimization process for calculating a desired stress distribution as described in the Example, below. Initial parameters are produced by a theoretical model. Then, the initial parameters are input into a Finite Element Analysis (FEA) model which calculates the current surface profile and outputs the difference from a desired one by means of a merit function (MF). The FEA model is connected with numerical optimization software (ISIGHT) so that an iteration loop is established to minimize the MF by optimizing the parameters.

The diagram of the optimization process is illustrated in FIG. 8.

As with nearly all fitting procedures, convergence requires that the initial guess not be too far away from a best fit. In order to have a good starting point for the best fit, a model of required stresses was derived that was based on the geometry, the material and the initial profile of a mirror. Here it was found to be sufficient to assume a uniform stress as the initial conditions. Then, the initial parameters were calculated for the fit based on the difference of curvature (DOC) between the measured initial surface profile and the target profile.

FIGS. 9A-9D shows the results of the iterations based on computations using a combination of ABAQUS (FEA software) and ISIGHT (Optimization software). The commercial finite element code ABAQUS was selected due to its seamless integration with the commercial optimization software ISIGHT, needed for an iterative process for the process. Calculated surface profile was compared with the target profile by means of a merit function (MF), which is defined as follows (Equation 3):

$$MF = \sqrt{\frac{1}{M}\sum_{i=0}^{M}(h_{target}(x_i) - h_{current}(x_i))^2} \quad (3)$$

where $x_i$ is the discrete location, and $h_{current}(x_i)$ is the calculated height while $h_{target}(x_i)$ stands for the target profile. M is the total number of the discrete locations on the surface, and MF means the standard deviation between the calculated profile and the target profile. In order to determine the optimum of spatially distributed stresses, an ISIGHT algorithm was used to find the optimum of the parameters by minimizing the MF. In particular, a present Hook-Jeeves algorithm was used due to its efficiency.

The optimization was carried out on a physical sample, which was the glass substrate with an intrinsic curvature. The goal was to make it flatter. Assuming the effect of stress on part curvature is reversible, the approach was to start with an FEA model with a flat surface, then optimize the stress distribution such that the deformable shape conforms to the initial measured curved surface. Then the stress sign to be used in the coating process was reversed to bring the initially curved surface to the flat one.

Figure 9A:
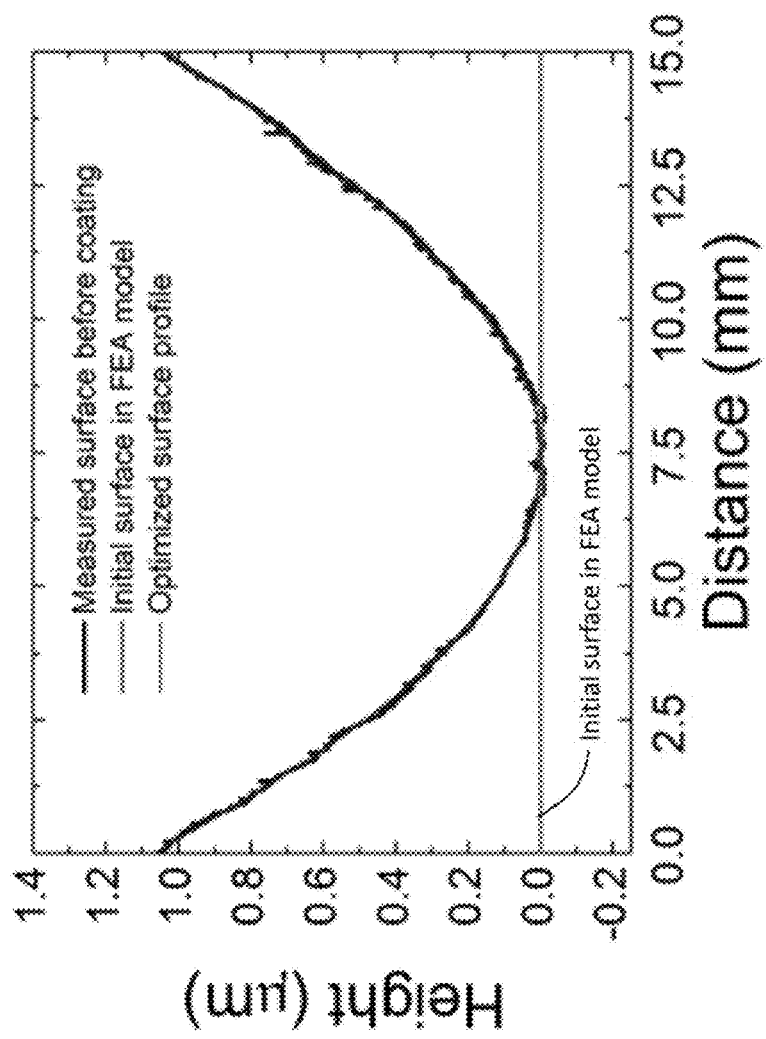
FIGS. 9A-9D illustrate the process of correcting the surface profile of a glass strip.
Figure 9B:
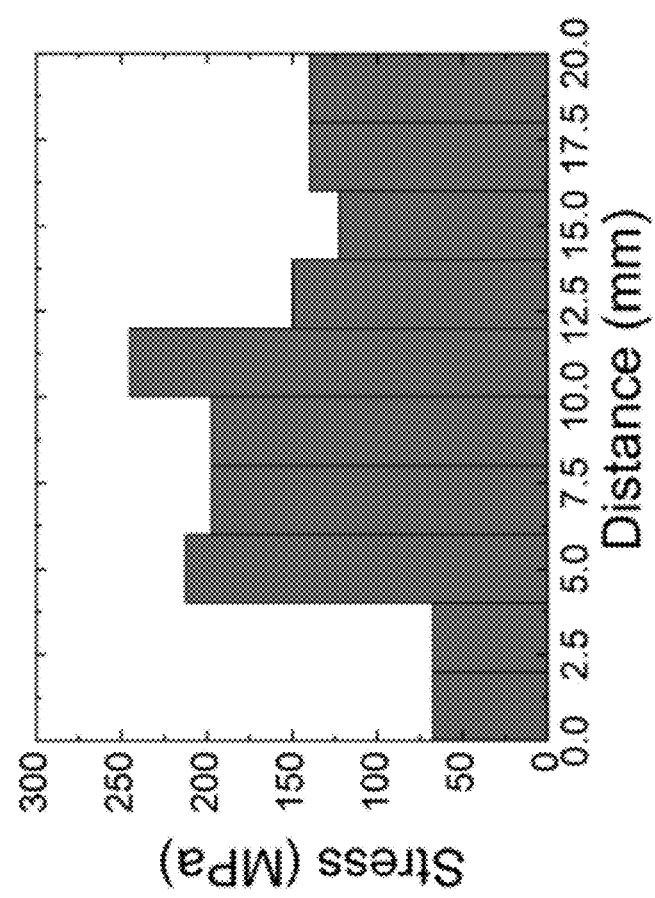

FIG. 9A shows the measured surface profile before coating, the initial surface in FEA, and the resulting surface profile after stress correction in FEA ("optimized surface profile"). The corrected surface profile and the measured surface profile match extremely well. This demonstrates that the process was successful. FIG. 9B shows the optimized stress distribution.

Figure 9C:
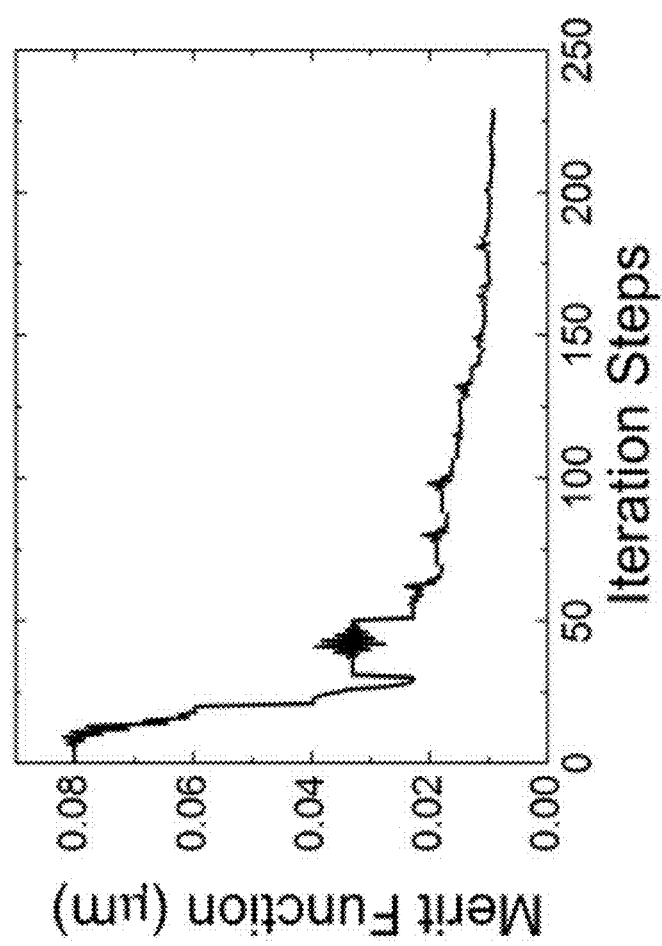
Figure 9D:
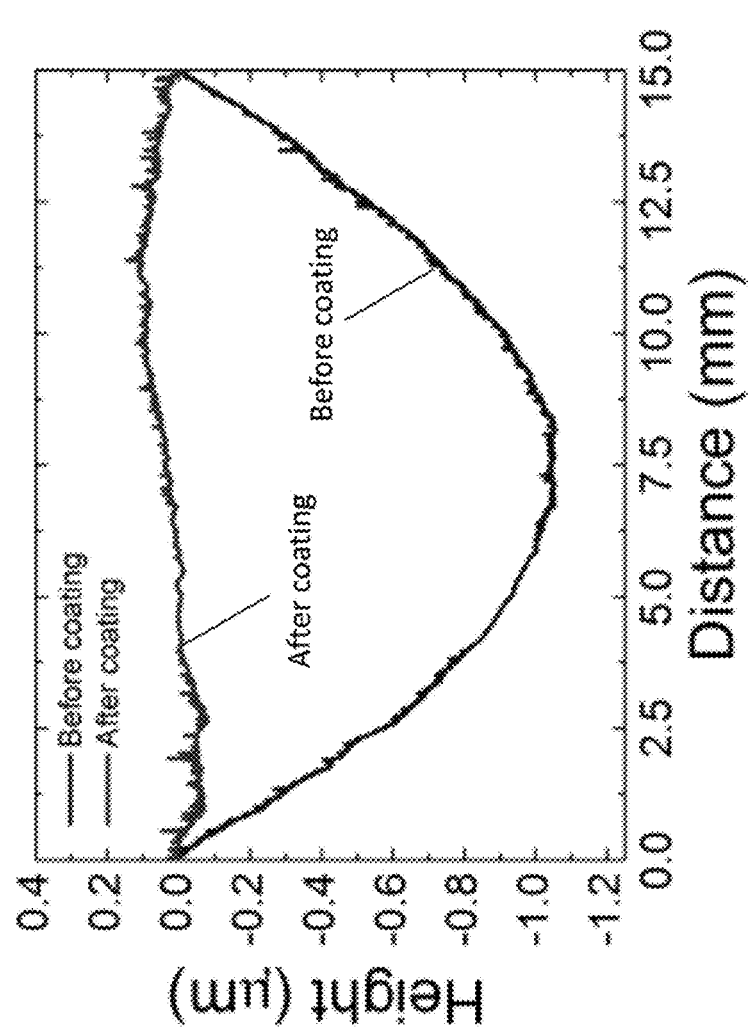

FIG. 9C illustrates the evolution of the merit function during the iteration process. FIG. 9D shows real fabrication results, including the measured surface profiles before coating and after coating. The difference of the coated surface from the flat one is about 0.1 µm, which is consistent with the result shown in FIG. 6. The measured result demonstrates the success of the process, i.e., with the combination of the optimization and the stress manipulated coating, the surface of a glass strip can be improved by a factor of 10.

Applications on a Full-Size Mirror

Figure 10:
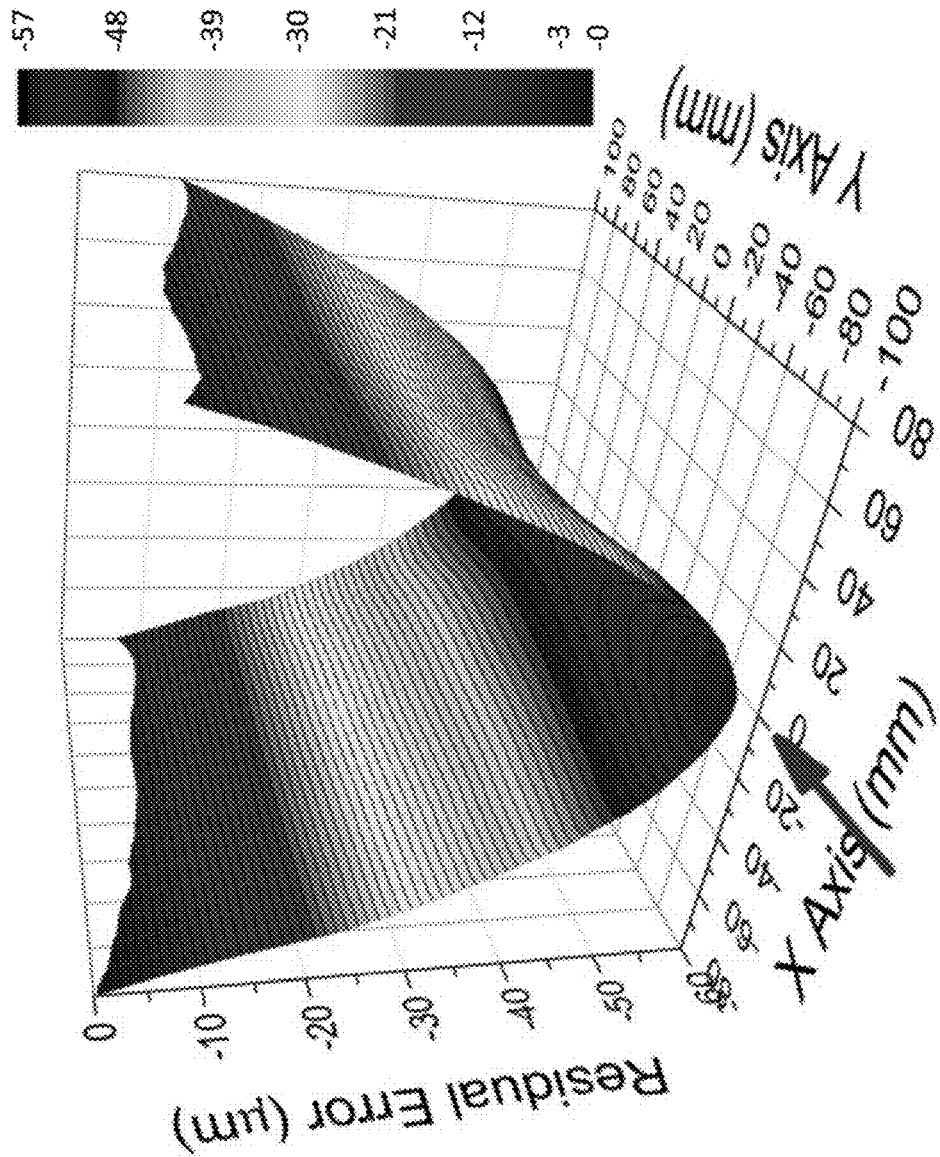
FIG. 10 shows a surface height error map of an X-ray telescope mirror. Data were provided by INAF Astronomical Observatory of Brera. Modeling was done along a 1-D profile in the direction of the arrow.

Thus far, this Example has presented 1-D results based on coating relatively small strips with 0.2 mm thickness. Now the work is extended to demonstrate the feasibility of applying the stress control method to full-sized X-ray telescope mirror segments by using data from a prototype X-ray telescope mirror shell. FIG. 10 shows a residual error map of an X-ray telescope mirror segment measured by the INAF Astronomical Observatory of Brera, Italy. (See M. Civitani, S. Basso, M. Ghigo, G. Pareschi, B. Salmaso, D. Spiga, G. Tagliaferri, G. Vecchi, V. Burwitz, G. D. Hartner, and B. Menz, "X-ray optical units made of glass: achievements and perspectives," Proc. SPIE 9144, 914416 (2014).) The dimension of the slumped glass (D263T) mirror is 200 mm×200 mm, 0.4 mm thick.

In FIG. 10, the maximum residual error is about 60 µm relative to the curvature along the X axis. However, the error along the incident direction is the most important for image quality, and thus modeling was carried out along a 1-D profile in the Y axis direction at the center of the mirror (arrow shown in FIG. 10). A stress manipulated coating was modeled on the back (non-reflecting) side of the INAF mirror shell to correct the 1-D profile. For completeness, mirrors were modeled with 0.2 mm, and 0.8 mm thickness as well as the actual INAF mirror thickness of 0.4 mm.

Figure 11A:
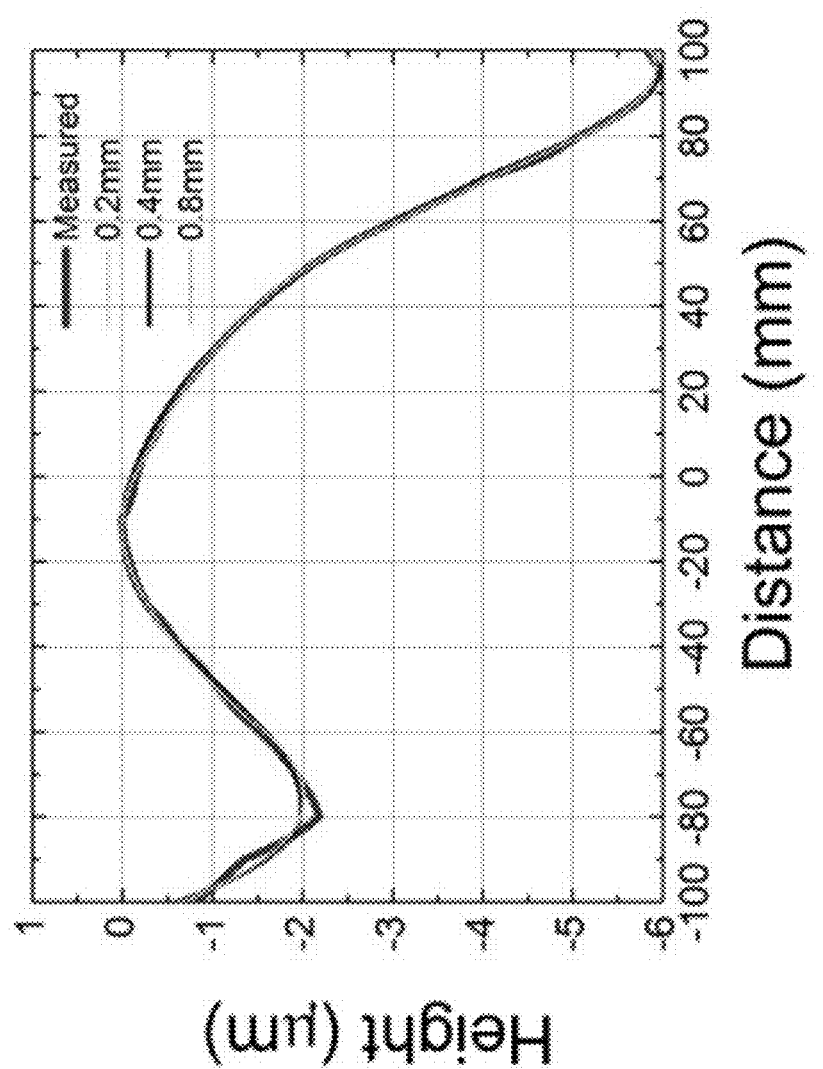
FIGS. 11A-11D show the results of modeling the mirror of FIG. 10 and determination of the optimized stress distribution for a coating to be deposited for correction of the figure errors of the mirror. Similar to FIG. 9A.
Figure 11B:
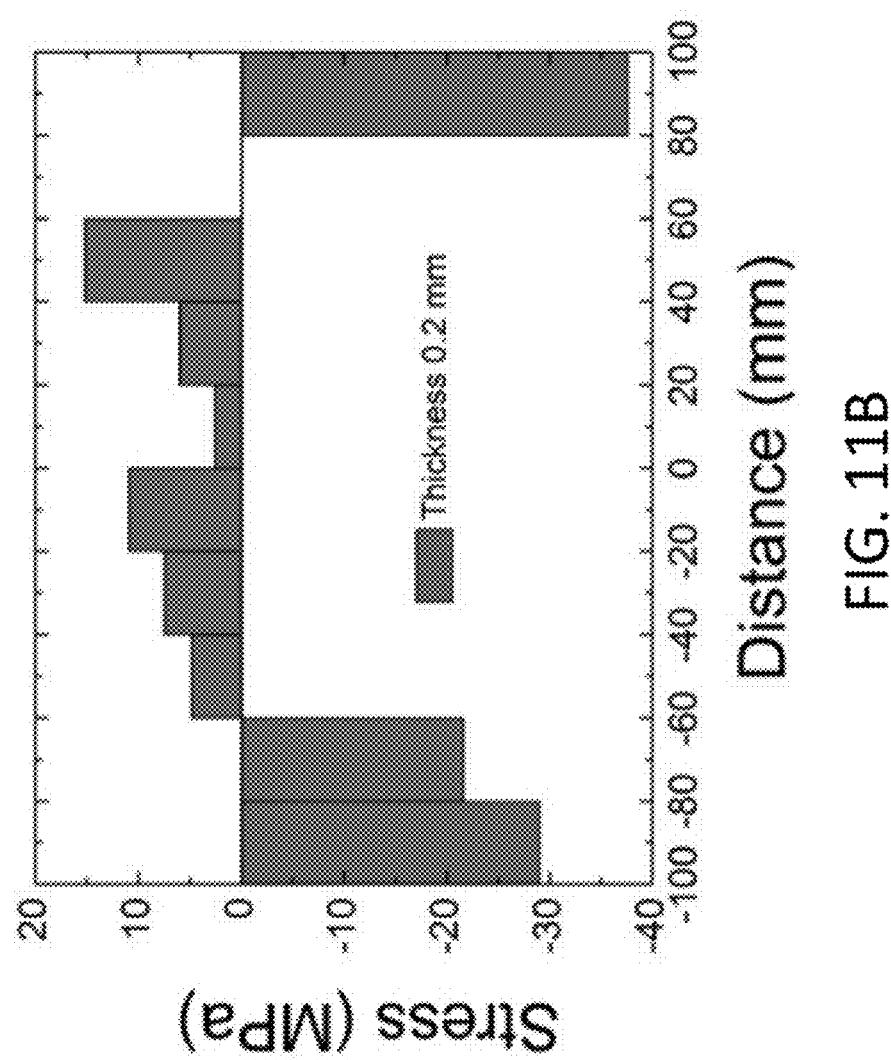

As shown in FIG. 11A, the optimized surface profiles with the different thicknesses are similar. However, the amplitudes of the optimized stress distributions are different. In particular, as shown in FIG. 11B, when the thickness is 0.2 mm, the average stress to be added in the coating is within Mega Pascal level, which is one order smaller than that in FIG. 9B. Above, repeatability was demonstrated with a precision in the DOC of 0.00053/m, which corresponds to ~3 MPa. Therefore, the average optimized amplitude of the stresses in FIG. 11B is close to the repeatability precision achievable on a 0.2 mm thickness mirror. However, the easy solution is to use a thicker mirror shell.

Figure 11C:
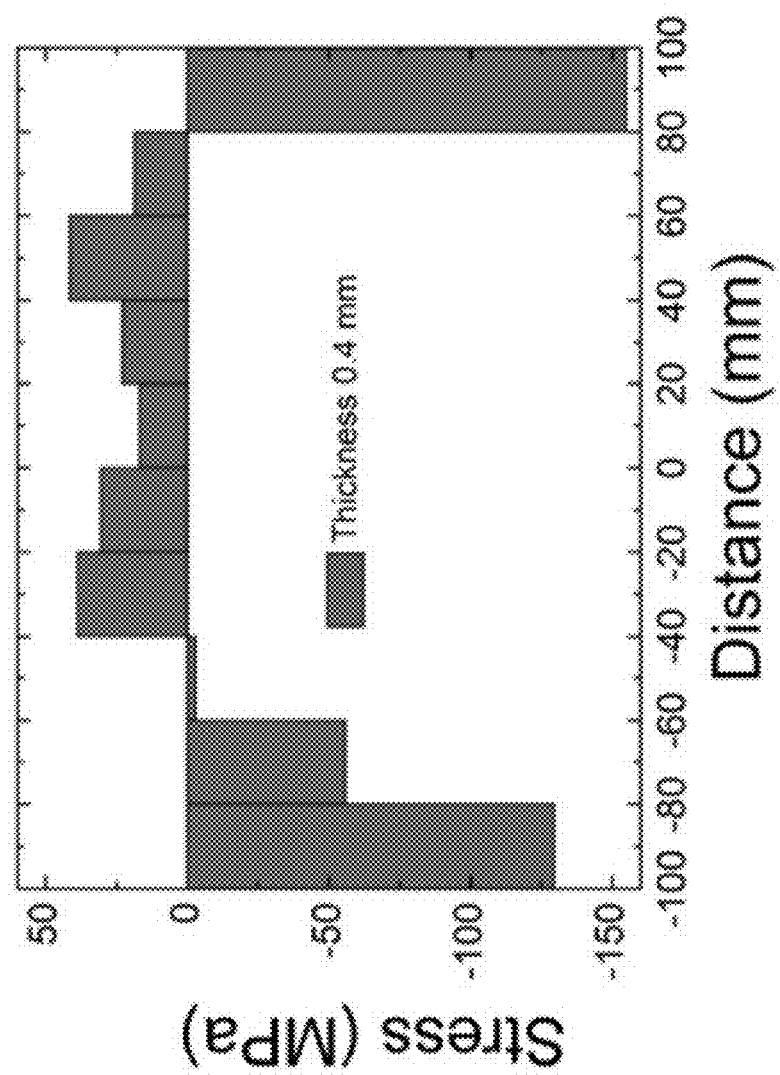
Figure 11D:
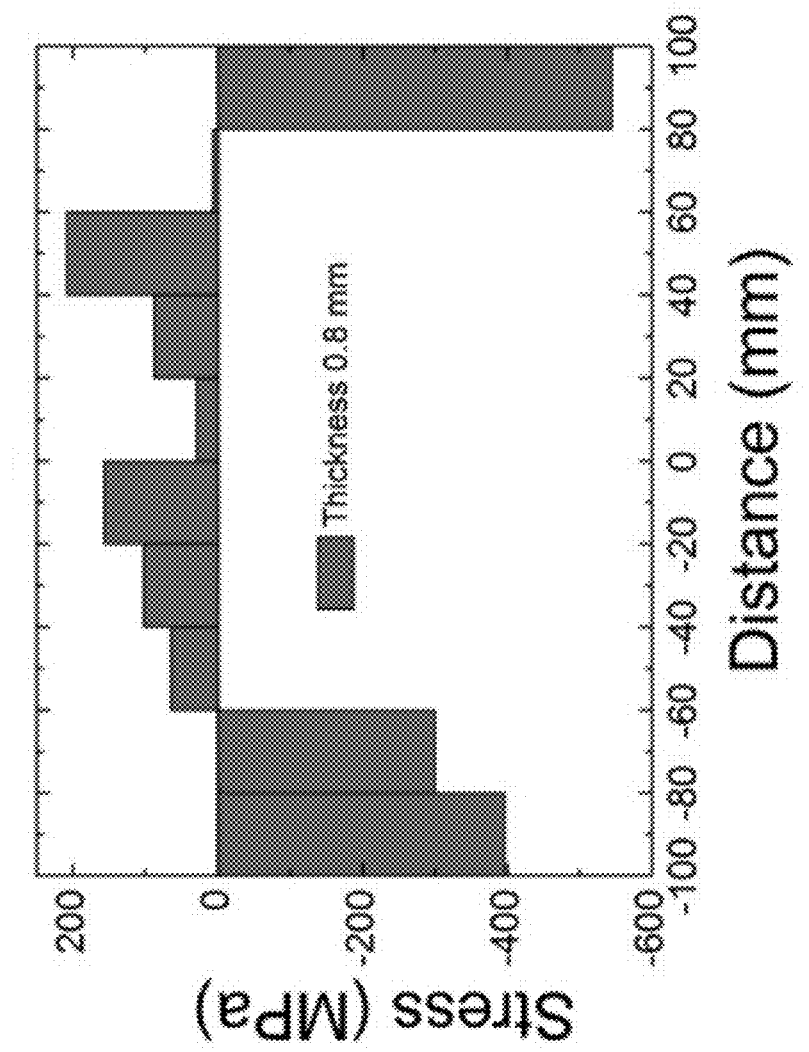

As a comparison, mirrors with the thickness of 0.4 mm (FIG. 11C) and 0.8 mm (FIG. 11D) require much higher stresses to balance the surface profile. Especially in case of the 0.8 mm thick mirror, the average amplitude to be added in the coating is over 150 MPa, which is still quite achievable from the current coating system. However, a 0.4 mm thick mirror could also be selected for future X-ray telescope missions. In this case, the current process is slightly sensitive. The strategy to reduce the sensitivity is to reduce the thickness of the coating or use a different coating material.

Conclusions

In summary, this Example demonstrates a stress manipulated coating process on the non-reflection side to reshape the surface profile for lightweight X-ray telescope mirrors. The stress-stability test conducted by monitoring the DOCs of five coated samples for 14 weeks showed slope stabilities of about 1 arc-second. Furthermore, this Example demonstrates the use of a calibration process to carry out a controlled shape change. Thus, this Example supports the use of the coating process in the fabrication of affordable lightweight optics for future 1 arc-second resolution X-ray observatories. Finally, this Example describes an efficient optimization strategy to calculate the stress distributions for a target profile. The combination of the optimization strategy and the coating process improves mirror surfaces by at least a factor of 10.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical application 1216s of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a stress distributed coating layer, the method comprising:
   depositing a coating material emanating from a source at a first location on a backside of an optical substrate at a first bias voltage to provide a first coating region at the first location characterized by a first stress; and
   depositing the coating material at a second location on the backside of the optical substrate at a second bias voltage to provide a second coating region at the second location characterized by a second stress;
   wherein bias voltage refers to a voltage difference between the source and the backside of the optical substrate,
   thereby, forming a stress distributed coating layer on the backside of the optical substrate comprising the first and second coating regions, wherein the stress produced by the stress distributed coating layer on the backside of the optical substrate varies as a function of position across the backside of the optical substrate.

2. The method of claim 1, further comprising depositing the coating material at a plurality of locations on the backside of the optical substrate at a plurality of bias voltages to provide a plurality of coating regions characterized by a plurality of stresses, wherein the first and second locations are ones of the plurality of locations, the first and second bias voltages are ones of the plurality of bias voltages, and the first and second coating regions are ones of the plurality of coating regions.

3. The method of claim 1, wherein the stress distributed coating layer is characterized by a one-dimensional stress distribution, wherein the stress produced by the stress distributed coating layer varies along an axis parallel to the direction of incident radiation to be received by the optical substrate.

4. The method of claim 1, wherein the optical substrate is characterized by an initial surface profile and the stress distributed coating layer is characterized by a predetermined stress distribution which corrects the deviations in the initial surface profile from a target surface profile.

5. The method of claim 1, wherein the thickness of the stress distributed coating layer is substantially uniform along the plane of the stress distributed coating layer.

6. The method of claim 1, wherein the stress distributed coating layer is continuous comprising two or more contiguous coating regions.

7. The method of claim 1, wherein the method is carried out on a sputtering deposition apparatus.

8. The method of claim 7, wherein the sputtering deposition apparatus is a DC magnetron sputtering deposition apparatus.

9. The method of claim 1, wherein the optical substrate is a mirror.

10. The method of claim 9, wherein the mirror is a replicated mirror configured to reflect light within the X-ray portion of the electromagnetic spectrum.

11. The method of claim 1, further comprising determining, by a processor, bias voltage value distribution data comprising a set of bias voltage values and location values to be used during the deposition steps of the method.

12. The method of claim 11, wherein the processor is part of a computing device comprising the processor and a non-transitory computer-readable medium comprising instructions that, when executed by the processor, cause the computing device to
   calculate the bias voltage value distribution data comprising the set of bias voltage values and location values from optimized stress distribution data comprising a set of optimized stress values and the location values; and
   output the calculated bias voltage value distribution data for use during the deposition steps of the method.

13. The method of claim 12, the non-transitory computer-readable medium further comprising instructions that, when executed by the processor, cause the computing device to calculate the optimized stress distribution data from initial stress distribution data comprising a set of initial stress values and the location values.

14. The method of claim 13, the non-transitory computer-readable medium further comprising instructions that, when executed by the processor, cause the computing device to
   calculate a surface profile corresponding to the initial stress distribution data; and
   compare the calculated surface profile to a target surface profile via a merit function MF $$MF = \sqrt{\frac{1}{M} \sum_{i=0}^{M} (h_{target}(x_i) - h_{current}(x_i))^2}$$

where $x_i$ is one of the location values, $h_{current}(x_i)$ is a height of the calculated surface profile, $h_{target}(x_i)$ is a height of the target surface profile, and M is a total number of the location values,
   wherein, adjusted stress distribution data comprising a set of adjusted stress values and the location values is generated, by the processor, until the MF is less than a threshold value so that the bias voltage value distribution data is only calculated if the MF is less than the threshold value.

15. The method of claim 14, the non-transitory computer-readable medium further comprising instructions that, when executed by the processor, cause the computing device to calculate the initial stress distribution data from received initial surface profile data for the optical substrate and target surface profile data for the optical substrate.

16. A method of forming a stress distributed coating layer, the method comprising:
   depositing a coating material emanating from a source onto a backside of an optical substrate using a deposition apparatus configured to adjust a relative position of the source and the backside of an optical substrate; and
   adjusting a bias voltage between the source and the backside of the optical substrate during the deposition of the coating material as a function of the relative position of the source and the backside of the optical substrate, the bias voltage referring to a voltage difference between the source and the backside of the optical substrate, to form a stress distributed coating layer on the backside of the optical substrate, wherein the stress produced by the stress distributed coating layer on the backside of the optical substrate varies as a function of position across the backside of the optical substrate.

* * * * *